(12) United States Patent (10) Patent No.: US 9,052,348 B2
Srikumar et al. (45) Date of Patent: Jun. 9, 2015

(54) RACK SYSTEM AND A METHOD FOR PROCESSING MANUFACTURED PRODUCTS

(75) Inventors: Kesavan Srikumar, Cupertino, CA (US); John Chung, Santa Clara, CA (US)

(73) Assignee: Aviat U.S., Inc., Santa Clara, CA (US)

( * ) Notice: Subject to any disclaimer, the term of this patent is extended or adjusted under 35 U.S.C. 154(b) by 1485 days.

(21) Appl. No.: 11/836,491

(22) Filed: Aug. 9, 2007

(65) Prior Publication Data

US 2009/0038420 A1    Feb. 12, 2009

(51) Int. Cl.
| | |
|---|---|
| H05K 7/02 | (2006.01) |
| H05K 7/04 | (2006.01) |
| H02B 13/02 | (2006.01) |
| G01R 31/36 | (2006.01) |
| G01R 31/00 | (2006.01) |
| G01R 31/20 | (2006.01) |
| G01R 31/01 | (2006.01) |

(52) U.S. Cl.
CPC ..................................... *G01R 31/01* (2013.01)

(58) Field of Classification Search
CPC . G01R 31/01; G01R 31/2806; G01R 31/2808
USPC .......................... 361/810, 803, 608, 614, 807; 324/754.08, 750.13, 750.15, 750.19, 324/750.22, 750.25, 750.26
See application file for complete search history.

(56) References Cited

U.S. PATENT DOCUMENTS

| | | | |
|---|---|---|---|
| 4,683,424 A | | 7/1987 | Cutright et al. |
| 4,764,847 A | * | 8/1988 | Eisenblatter et al. ......... 361/707 |
| 5,284,254 A | * | 2/1994 | Rinderer .......................... 211/26 |
| 5,394,459 A | * | 2/1995 | Djuphammar et al. ..... 379/15.01 |
| 5,400,640 A | * | 3/1995 | Stuckey ........................ 73/12.14 |
| 5,534,786 A | | 7/1996 | Kaneko et al. |

(Continued)

FOREIGN PATENT DOCUMENTS

| | | |
|---|---|---|
| DE | 10214834 | 10/2003 |
| EP | 0955549 | 11/1999 |

(Continued)

OTHER PUBLICATIONS

PCT International Search Report and Written Opinion dated Nov. 5, 2008, for International Application No. PCT/US/072692.

(Continued)

*Primary Examiner* — Chau N Nguyen
*Assistant Examiner* — Roshn Varghese
(74) *Attorney, Agent, or Firm* — Sheppard, Mullin, Richter & Hampton LLP

(57) ABSTRACT

A rack system and method are provided for processing manufactured products prior to shipment. To simulate reality, the design of such rack system and method contemplates replicating field conditions for use of the manufactured products. A rack system for processing units of manufactured products may comprise one or more plates coupled to a frame. A preferred approach includes designing the rack for use by an operator without specialized skills. This approach includes verifying that there is a match between the configuration of the unit mounted on the plate and the operating mode of the plate before processing can commence. The rack may include a detector for obtaining data from the plate and unit and a processor for comparing the obtained data to determine whether there is a match. A rack system designed using this approach can be useful in processing outdoor units of a split-mount system such as a microwave radio system.

42 Claims, 19 Drawing Sheets

(56) References Cited

U.S. PATENT DOCUMENTS

| | | | |
|---|---|---|---|
| 5,566,088 A * | 10/1996 | Herscher et al. | 702/123 |
| 6,088,582 A | 7/2000 | Canora et al. | |
| 6,122,176 A * | 9/2000 | Clements | 361/752 |
| 6,202,824 B1 | 3/2001 | Goss et al. | |
| 6,268,740 B1 | 7/2001 | Iida | |
| 6,473,301 B1 | 10/2002 | Levy et al. | |
| 6,654,255 B2 * | 11/2003 | Kruse et al. | 361/799 |
| 6,819,099 B1 * | 11/2004 | Repko et al. | 324/750.25 |
| 6,903,910 B1 * | 6/2005 | Griesing et al. | 361/38 |
| 7,036,734 B2 * | 5/2006 | Baker | 343/874 |
| 7,212,172 B2 | 5/2007 | Nicolae | |
| 7,218,095 B2 | 5/2007 | Hill | |
| 2001/0005145 A1 | 6/2001 | White et al. | |
| 2002/0029475 A1 | 3/2002 | Myung et al. | |
| 2002/0084911 A1 | 7/2002 | Zhu | |
| 2003/0057984 A1 | 3/2003 | Akram | |
| 2003/0184035 A1 | 10/2003 | Yu | |
| 2005/0113949 A1 | 5/2005 | Honda | |
| 2005/0196126 A1 * | 9/2005 | Sugiyama | 385/147 |
| 2006/0022664 A1 * | 2/2006 | Hill | 324/158.1 |
| 2006/0085087 A1 | 4/2006 | Hass et al. | |
| 2006/0165364 A1 * | 7/2006 | Frohlich et al. | 385/135 |
| 2006/0235637 A1 | 10/2006 | Brayton et al. | |
| 2007/0044581 A1 | 3/2007 | Wilcox et al. | |

FOREIGN PATENT DOCUMENTS

| | | |
|---|---|---|
| JP | 56031880 | 3/1981 |
| JP | 4203980 | 7/1992 |
| JP | 2001349918 | 12/2001 |

OTHER PUBLICATIONS

Extended European Search Report dated May 4, 2012 for European Application No. 08797537.1.

* cited by examiner

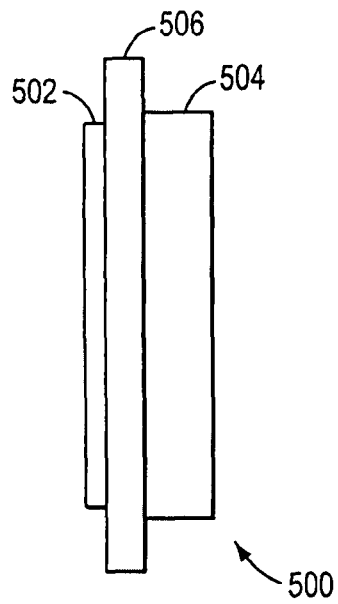
FIG. 5A-PART 1
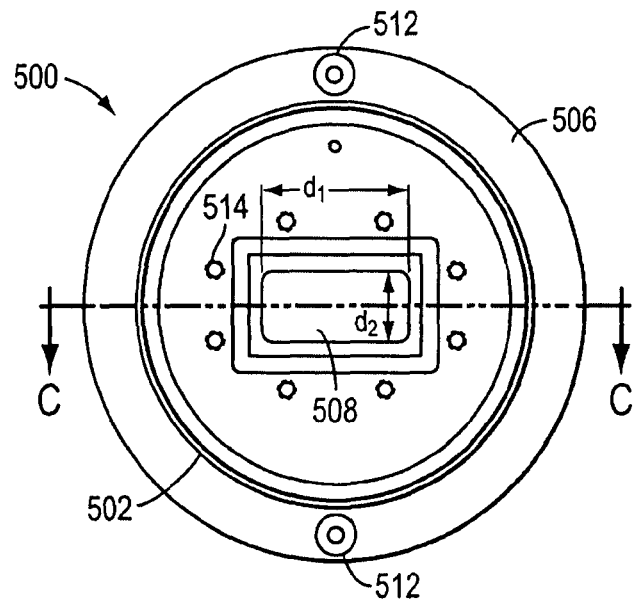
FIG. 5A-PART 2
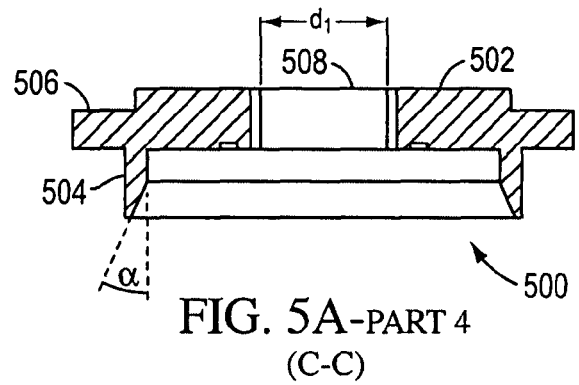
FIG. 5A-PART 4
(C-C)
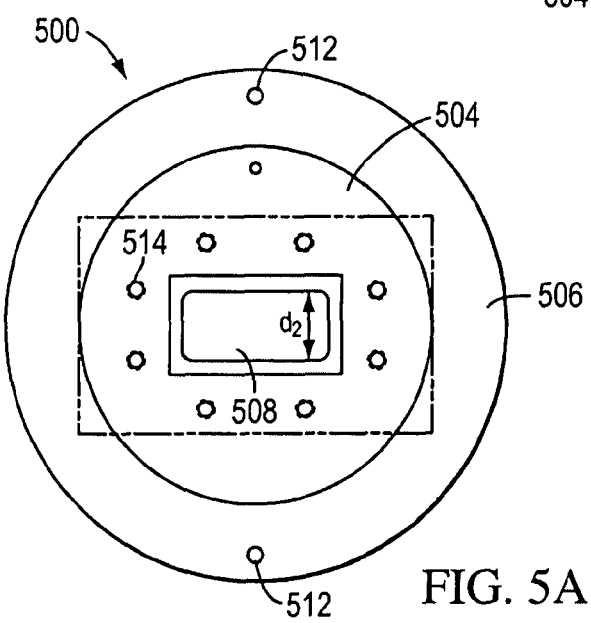
FIG. 5A-PART 3

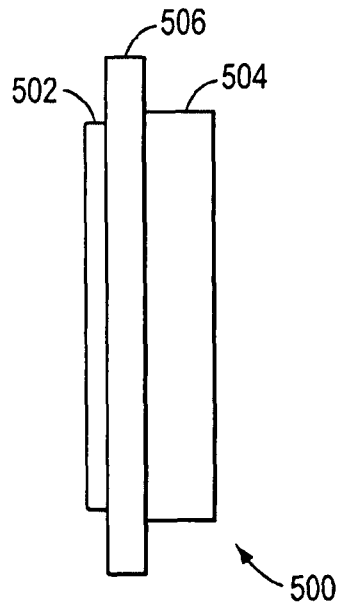
FIG. 5B-PART 1
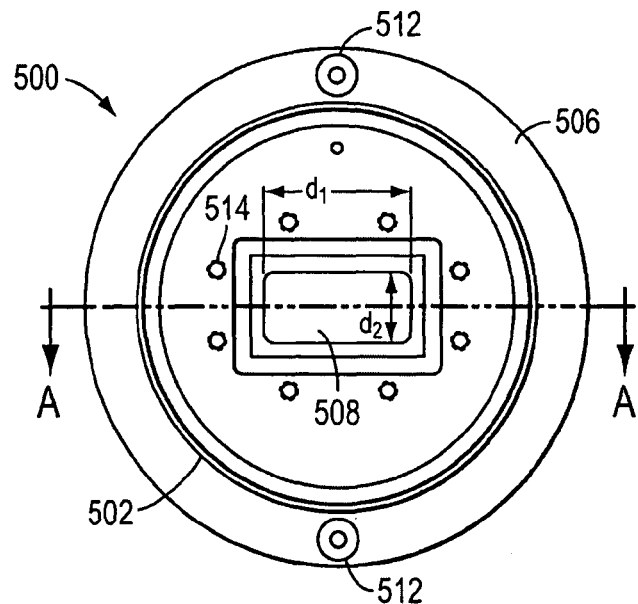
FIG. 5B-PART 2
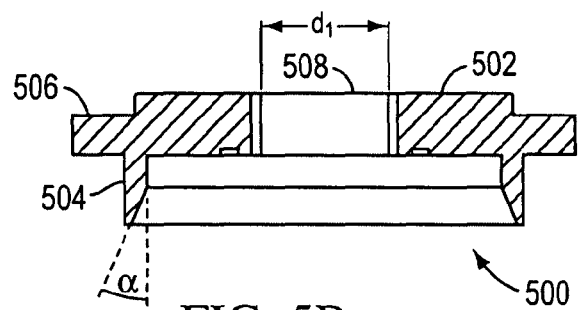
FIG. 5B-PART 4
(A-A)
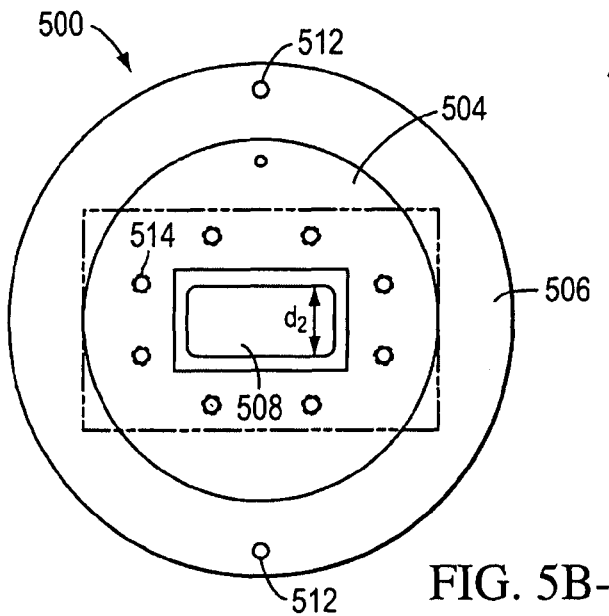
FIG. 5B-PART 3

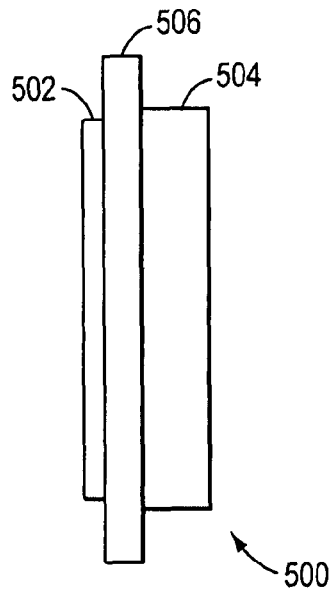
FIG. 5C-PART 1
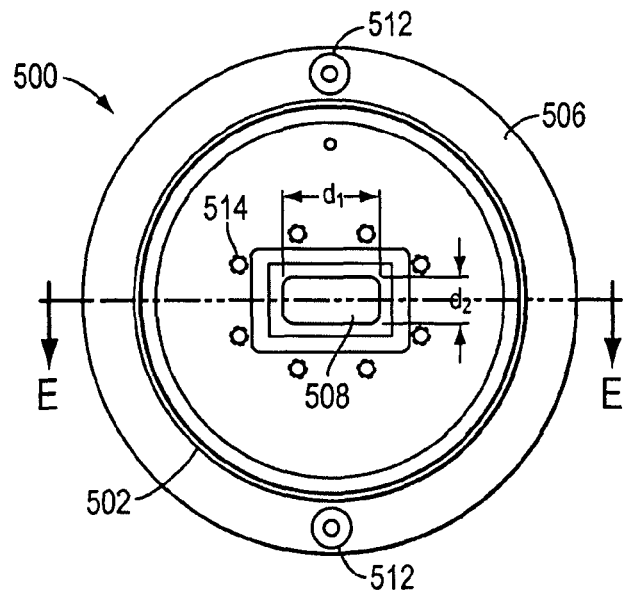
FIG. 5C-PART 2
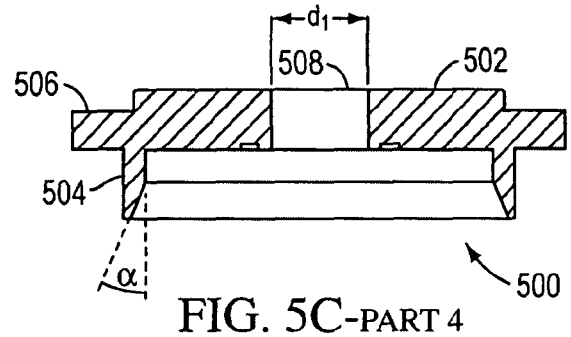
FIG. 5C-PART 4
(E-E)
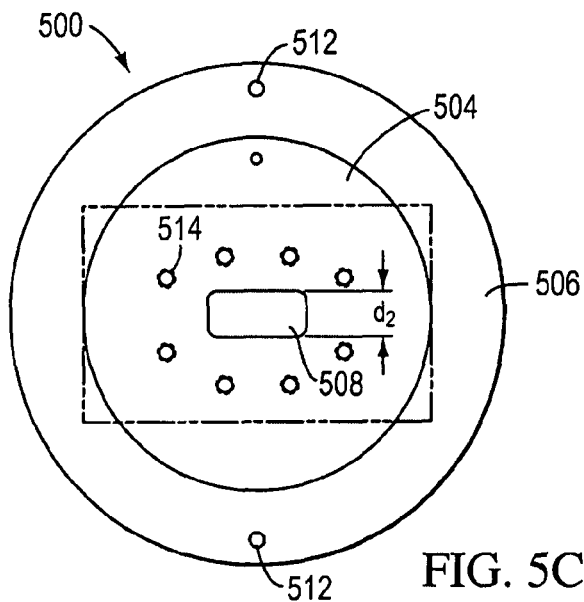
FIG. 5C-PART 3

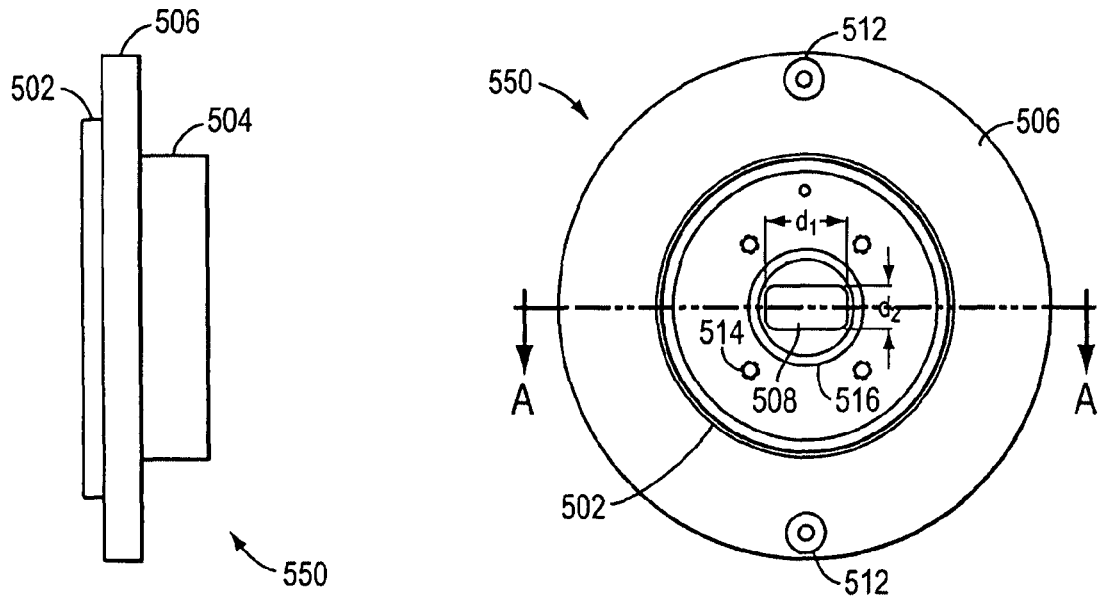
FIG. 5D-PART 1
FIG. 5D-PART 2
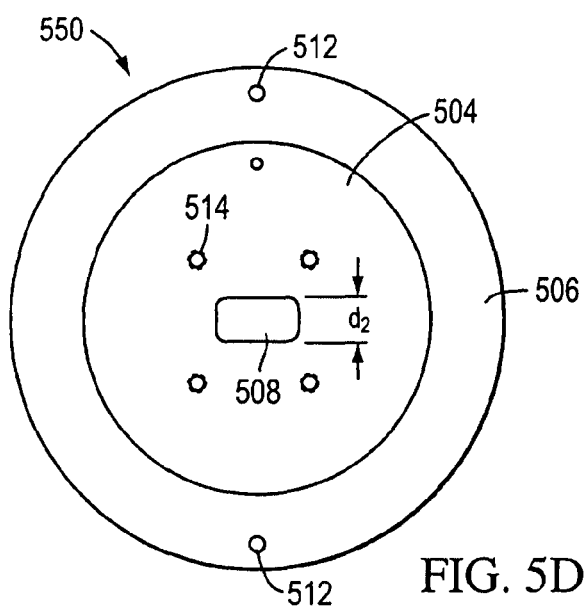
FIG. 5D-PART 3
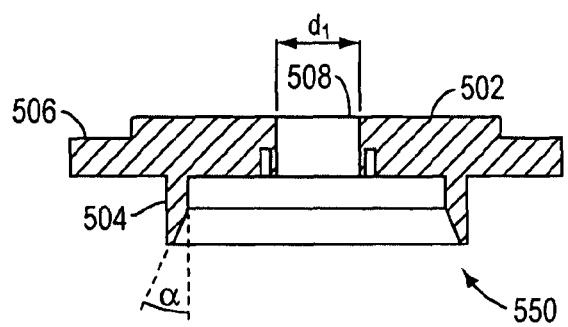
FIG. 5D-PART 4
(A-A)

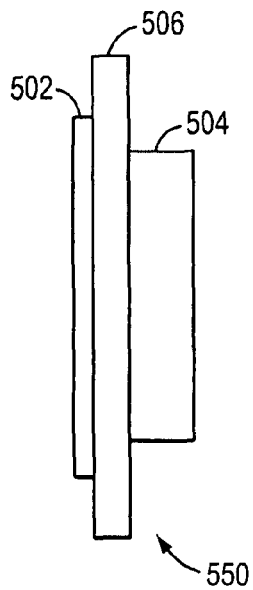
FIG. 5E-PART 1
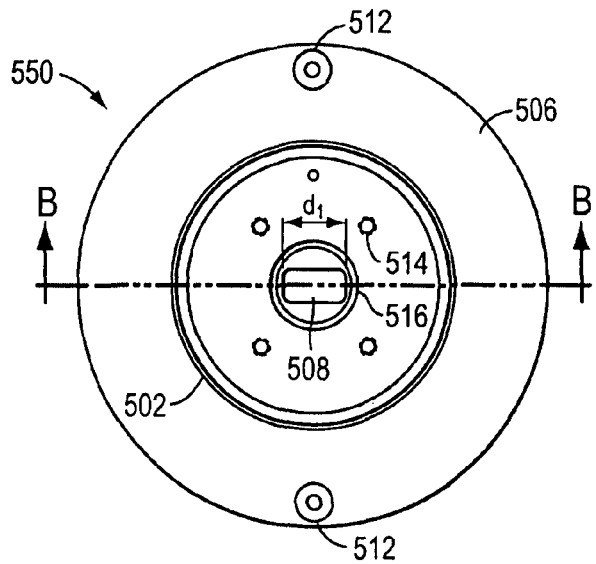
FIG. 5E-PART 2
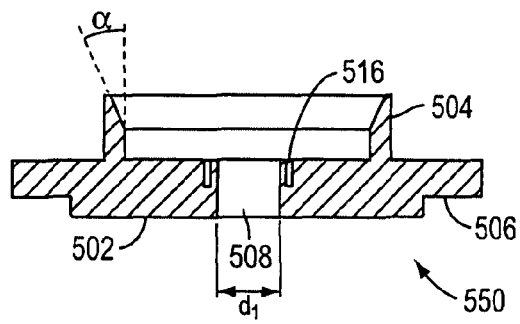
FIG. 5E-PART 4
(B-B)
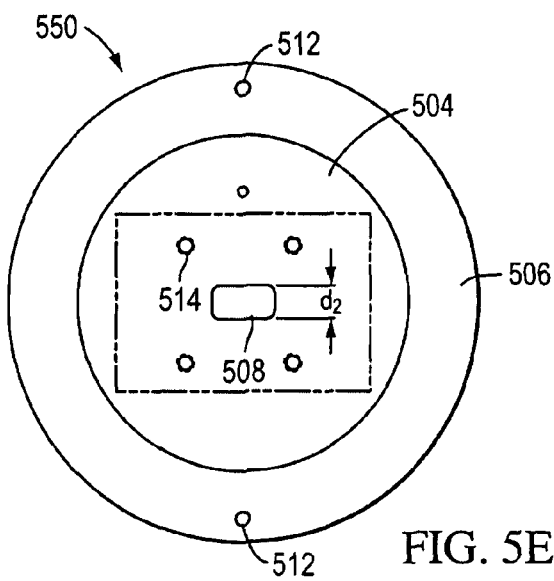
FIG. 5E-PART 3

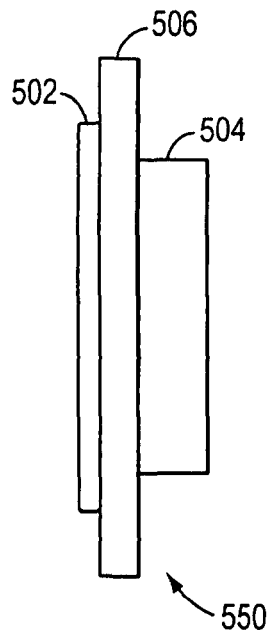
FIG. 5F-PART 1
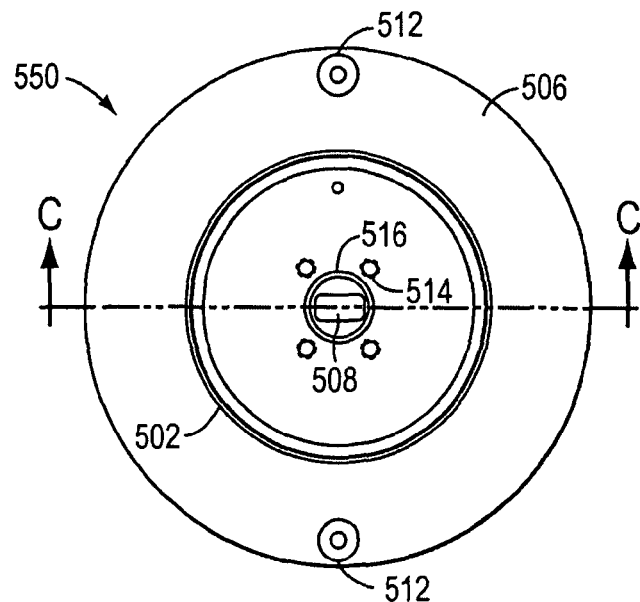
FIG. 5F-PART 2
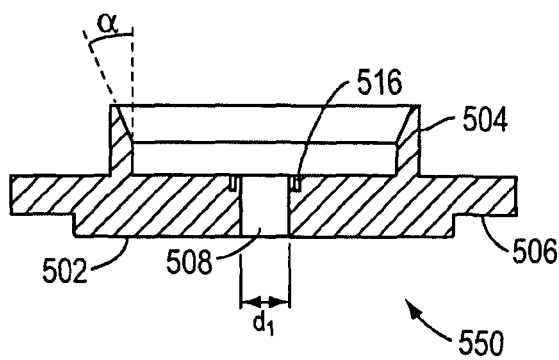
FIG. 5F-PART 4
(C-C)
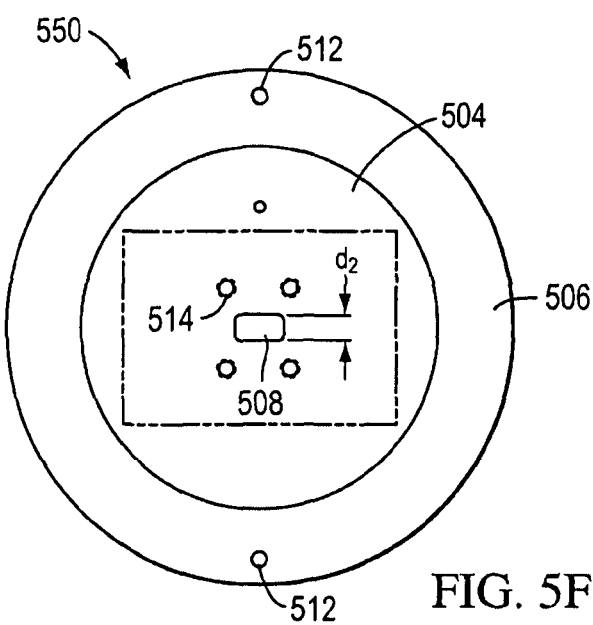
FIG. 5F-PART 3

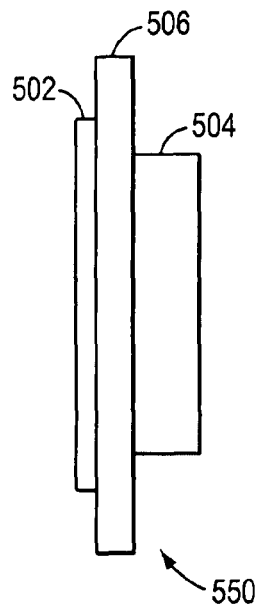
FIG. 5G-PART 1
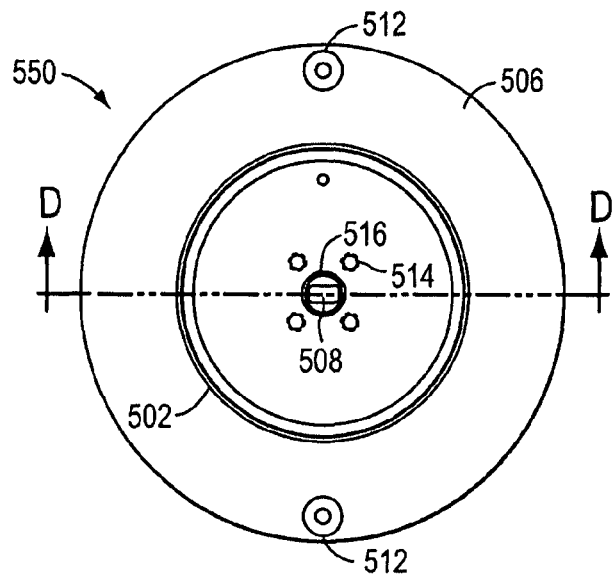
FIG. 5G-PART 2
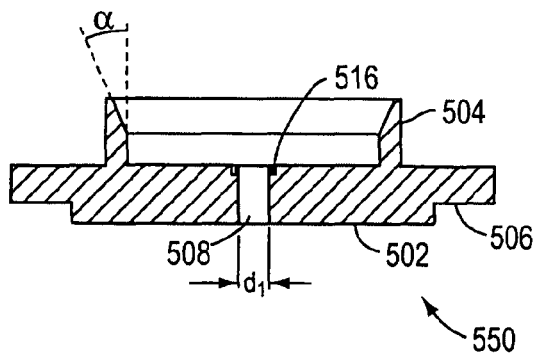
FIG. 5G-PART 4
(D-D)
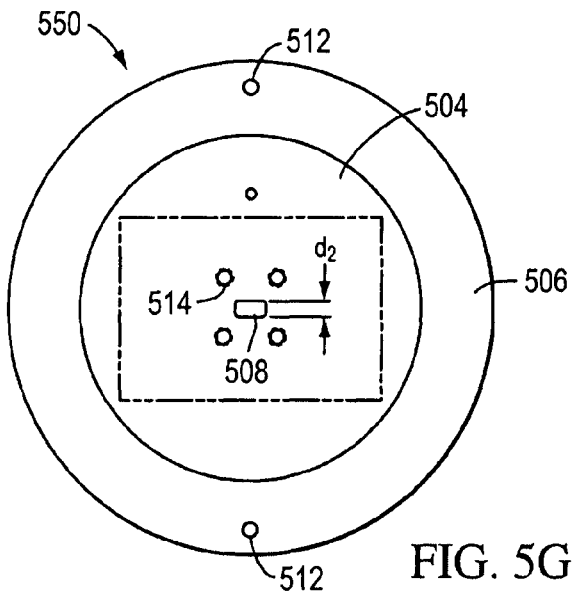
FIG. 5G-PART 3

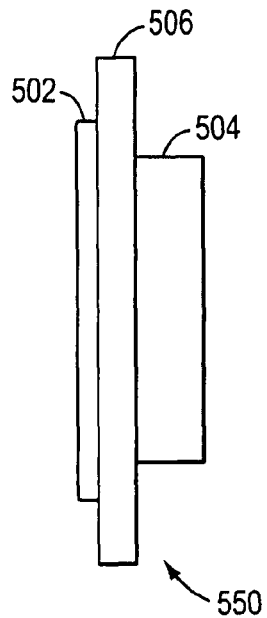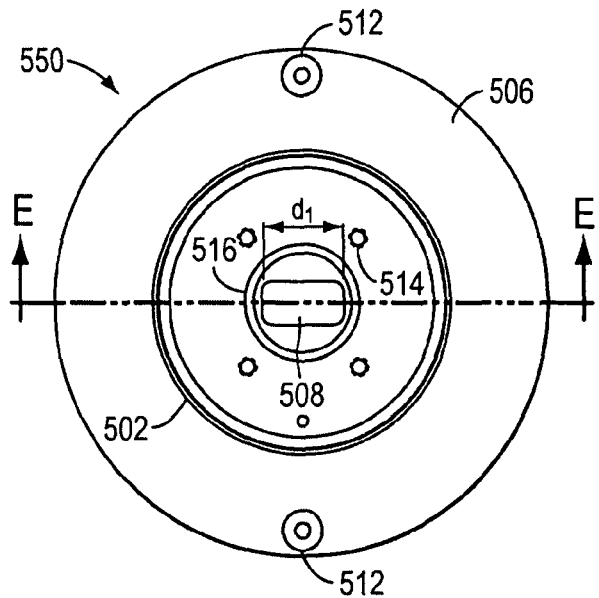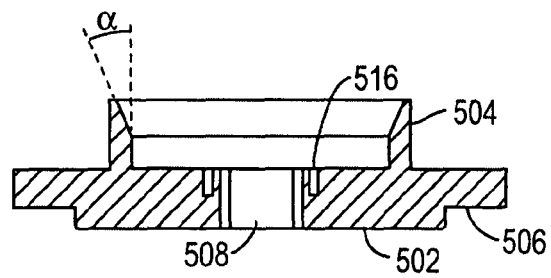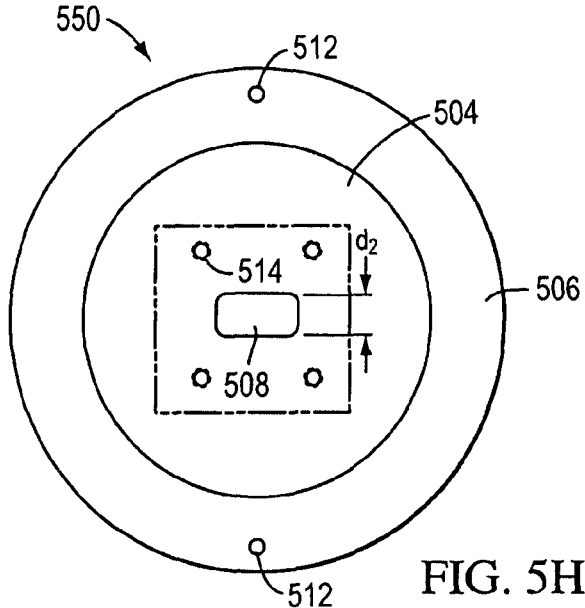
FIG. 5H-PART 1
FIG. 5H-PART 2
FIG. 5H-PART 4
(E-E)
FIG. 5H-PART 3

RACK SYSTEM AND A METHOD FOR PROCESSING MANUFACTURED PRODUCTS

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

TECHNICAL FIELD

This invention is generally related to manufacturing and, more specifically, to processing of manufactured products, such as microwave radios.

BACKGROUND

Manufacturing of products includes processing the finished product. To detect potential problems prior to shipping, such processing ideally replicates the use a purchaser will make of the product and the environment in which such product may be used (e.g., field conditions, laboratory conditions, etc.). Some products include technology in particularly skilled areas. Examples of skilled areas of technology include radio frequency and microwave technologies in products such as microwave radios, medical devices such as X-ray, computed axial tomography (CAT) or magnetic resonance imaging (MRI) machines, or fiber optics systems. Replicating the purchaser's use, conditions of use, or both, may include mounting the product in a particular way (e.g., in a vertical mode), in a special location (e.g., outdoors) or both. However, it may be difficult to process products mounted in such a way (for instance, products may end up being processed while mounted horizontally and face down on a test bench indoors).

Multiple units of manufactured product may need to be processed at the same time. Such processing may cause interference between units resulting in, for example, false failures. Examples of interference include power leakages and electromagnetic interference (EMI). These false failures may correspond to false errors and/or error measurements in data traffic.

Manufactured product often includes one or more subassemblies capable of configuration, such as operating frequency range, receive mode, transmit mode, network topology configuration settings, etc. Subassemblies may include components incorporated into a manufactured product. Processing of manufactured product ideally includes all possible combinations of product configurations and product use conditions. Many tasks involved in such processing require an operator skilled in the product technology, manufacturing processes and the customer's use and conditions of use of the manufactured product.

Misidentifying and erroneously processing or other mishandling of a manufactured product may result in unacceptable performance, failure to conform to regulations or standards, or other anticipated or unanticipated problems. In some skilled areas of technology, such as those involved in medical devices, product defects may cause physical harm. Therefore, there is a need to improve manufacturing methods and systems.

OVERVIEW

Various considerations in the design of manufacturing systems and methods are based, in part, on the foregoing observations. These considerations include the possible benefits of processing manufactured product in an environment similar to that in which the manufactured product will be used. One desired aspect of such design might be to substantially decrease the need for a skilled operator. Another desired aspect of such design might be to decrease the likelihood of unreliable results by, for example, reducing interference between units of manufactured product being processed.

In particular, the design contemplates rack systems and methods using them for processing of manufactured product that incorporates skilled areas of technology. One preferred approach includes mounting one but typically more than one of the manufactured products or units of manufactured product on a rack system. The rack system may include a carrier (e.g., base and wheels) to facilitate movement, such as to and from a test chamber. The rack system may be modular, for example, include a frame with multiple plates.

The plate design may include a structure for mounting a manufactured product on the plate substantially without fasteners. The mounting structure may include one or more attachment mechanisms each having a ramp and a stop coupled to the back side of the plate. Accordingly, the manufactured product may be configured with one or more mounting studs. A mounting stud coupled to a manufactured product is designed to fit into an insert end of the ramp and (by turning the manufactured product) it can be turned to scale the ramp until it reaches the stop.

Each plate may be configured for a different operating mode. The plates may be configured such that only a matching manufactured product may be processed when mounted on a plate (and mismatched products are properly rejected). A match may exist if a manufactured product, the plate on which it is mounted, and a connector communicatively coupling a manufactured product to a source of operating signals are configured for the same particular operating mode, such as an operating frequency range. To this end, the rack system may also include a detector for obtaining data necessary for determining whether a match exists between the manufacture product and the plate. Such data is thus associated with the manufactured product, the plate, the connector, or any combination thereof. Matching configurations can be done using a processor, software, program instructions, memory, and the like. Preferably, this approach includes notifying an operator if processing fails, such as if a mismatch is detected.

The plate may further include a shield for mitigating interference between units of manufactured product. During processing, the units may generate interference, the units may be affected by such interference, or both. By mitigating interference between units that are being processed, the design may reduce the likelihood of incorrectly rejecting units of manufactured product as failed units. This may in turn reduce the time required to look for the root cause of a false failure problem (such as false test result, bad data, etc.).

For processing manufactured products, the rack system may further include an adapter to which a manufactured product is operatively coupled via the connector. The adapter may allow for operating signals to be communicated to and from mounted units of manufactured product during processing thereof. A manufacturing system design using this approach may be useful for processing outdoor units of split-mount systems such as microwave radio systems.

This manufacturing system design provides advantages in addition to mitigating interferences and preventing mismatched units processing. Among such advantages is the ability to mount and dismount manufactured products on and off the plate substantially without needing additional fasteners. Another possible advantage is the ability to mount manufactured product at an angle or in a manner that otherwise simulates field mounting. For example, an outdoor unit of a split-mount microwave radio system may be mounted in a vertical mode to simulate air flow surrounding the unit and further to simulate the connection to the unit when field mounted.

Furthermore, the manufacturing system is designed to increase the repeatability and reliability of processing results and reduce the possibilities for human errors. The system configuration reduces set-up time by substantially eliminating steps of manually coupling units to test equipment, by reducing the time to mount and dismount manufactured product and to carry such manufactured product to and from a processing chamber. The system configuration allows less skilled operators to operate the manufacturing system for processing manufactured products that include technology in high skill areas. Therefore, such manufacturing systems can be easily installed at a contract manufacturer's facility and require low maintenance and training of new operators. Another possible advantage is that the adapter can facilitate communicating signals to and from and thereby operatively accessing and manipulating manufactured products once mounted on the rack system (without needing physical access to them).

Accordingly, the following embodiments are examples of a rack system and a method for processing manufactured products. In accordance with one embodiment, a rack system for processing units of manufactured products, includes a rack having a frame. The rack system typically also includes a plate configured for a particular operating mode coupled to the frame of the rack. The frame is typically configured to support a plurality of plates. Each plate includes an attachment mechanism adapted for removably mounting on the plate a manufactured product having a configuration. The rack system may further have an adapter coupled to the frame and configured for communicating operating signals to and from a manufactured product, when mounted on the plate, and a detector associated with the rack and configured for determining whether there is a match between the configuration of a manufactured product and the particular operating mode of the plate.

A rack system preferably also includes a shield attached to the plate and configured to mitigate interference generated by or affecting a manufactured product (i.e., interference with or from the manufactured product). In such rack, the detector includes a data retrieval device configured to obtain data from a manufactured product, the plate, and the rack. The obtained data may include an operating frequency range, a plate identifier, a rack identifier, a product identifier, a customer identifier, a serial number, a part number, or any combination thereof. The detector may further include a processor operatively coupled to the data retrieval device and configured to determine whether or not to commence processing of a manufactured product based on the data obtained from the data retrieval device. This includes determining whether or not there is a match on the basis of which the determination of whether or not to commence the processing is made. Hence, the rack system is advantageously configured so that it can be operated and maintained by an operator having substantially no skill in an area of technology which a manufactured product incorporates.

A rack system may further comprise a plate system associated with each plate. This is useful when the plate is configured for mounting thereon a plurality of manufactured products and the plate system is configured for communications between the plurality of manufactured products when so mounted. The plate system includes, for each manufactured product, an interface to such manufactured product, a unit adapter operatively coupled to the interface, and an attenuator operatively coupled to the unit adapter. A pair of the attenuators in the plate system are connected to each other via a cable in order to facilitate communications between manufactured products associated with them, when mounted on the plate.

According to one embodiment of a method for processing manufactured products, the method steps include providing a rack with a frame, the rack further including a plate configured for an operating mode and mounted on the frame, as well as a detector and an adapter. The method further includes removably mounting on the plate a manufactured product having a configuration, obtaining the operating mode from the plate and a configuration from the manufactured product via the detector, comparing and determining whether there is a match between the operating mode and the configuration, and, in response to determining that there is a match, allowing processing of that manufactured product to commence by communicating operating signals to and from such manufactured product via the adapter. However, in response to determining that there is no match, the method provides an indication and/or prevents processing of the manufactured product.

One application for rack systems and a method using them is in the manufacture of a wireless radio system, particularly one that operates in the microwave frequency range. Hence, such rack systems and methods may be adapted for processing outdoor units of split-mount wireless radio systems.

These and other features, aspects and advantages of the present invention will become better understood from the description herein, appended claims, and accompanying drawings as hereafter described.

BRIEF DESCRIPTION OF THE DRAWINGS

The accompanying drawings, which are incorporated in and constitute a part of this specification, illustrate various aspects of systems and methods for processing manufactured products and together with the description serve to explain various principles thereof. Wherever convenient, the same reference numbers will be used throughout the drawings to refer to the same or like elements.

FIGS. 5A-5H are each an illustration of a waveguide interface with diagrams (parts 1-4) of its side, front, rear and cross-section views.

DETAILED DESCRIPTION

Figure 1A:
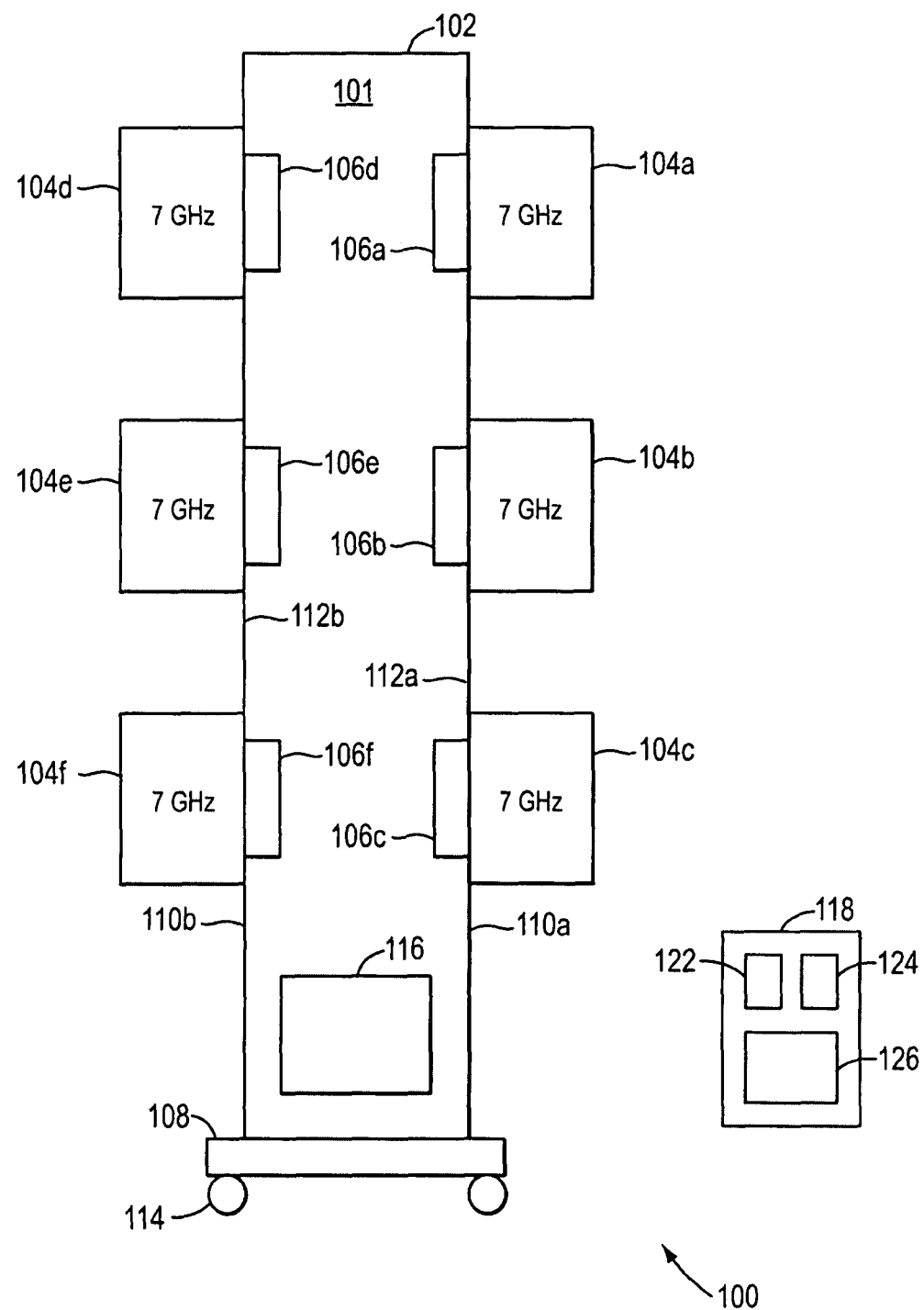
FIGS. 1A and 1B each illustrates a rack according to one embodiment.

This description is provided in the context of the present application for Letters Patent and its requirements to enable a person of ordinary skill in the art to make and use the invention. Various modifications to the embodiments described and shown are possible and the generic principles defined herein may be applied to these and other embodiments without departing from the spirit and scope of the invention. Thus, the present invention is to be accorded the widest scope consistent with the principles, features and teachings disclosed herein.

As mentioned, various embodiments of manufacturing systems and methods using them are designed for processing manufactured products. For convenience, but without introducing any limitation thereby, a single manufactured product of any kind can be referred to as a "unit" and multiple manufactured products of one or more kinds can be referred to, respectively, as "units of a manufactured product," "various units," "units of any kind," or simply "units."

A manufacturing system for processing one or more manufactured products may be implemented as a rack system. A rack system typically comprises a rack with a frame and a carrier such as a base with legs, skids or wheels. The frame may be formed as a skeleton structure or any other suitable structure. One or more plates may be coupled to the frame with each plate adapted for mounting thereon a manufactured product. The rack system may include multiple plates, where each plate may be configured for a different operating mode. Different plates with different operating modes can accommodate different types, configurations or versions of manufactured products. To this end, the rack system may also include an adapter for communicating various operating signals to and from manufactured products when mounted on the plate.

The preferred approach to designing a manufacturing system for processing manufactured products includes managing (e.g., permitting or preventing) the processing of a unit. Therefore, the rack system may further include a detector for obtaining data associated with individual units of any kind, individual plates, or both, and for determining whether a match exists between the configuration of an individual unit and the operating mode of the plate on which it is to be mounted. Any time a mismatch between a unit and a plate is detected, the rack system may prevent processing of such mismatched unit, notify the operator of such mismatch, or both. The operator may then be guided to take corrective action, typically by being instructed to replace the mismatched unit with a matching unit so as to allow for the processing to commence. For this, the operator need not be skilled.

The design approach for the foregoing takes into consideration the beneficial aspects as well as possible tradeoffs attributed to various manufacturing system designs. One design may include manually obtaining, e.g., by visual inspection, the configuration of a manufactured product, the operating mode of the plate or both. The configuration obtained may be recorded manually on paper or the like. Alternatively or additionally, the configuration may be recorded electronically, for example, in a computerized device including a memory (e.g., in the detector).

As an alternative, such design may include automated or automatic retrieval of data and/or manual, automated, or automatic determination that a match exists. A human error in the determination may not necessarily lead to a unit's subsequently failing processing. However, even if it passes processing, a unit of manufactured product may nonetheless fail in the field.

Thus, a preferred approach generally includes electronic means for obtaining data and verifying a match between the plate and a unit mounted thereon. The preferred approach further includes a rack, such as the one described above, which requires a relatively low-skilled operator even when a manufactured product incorporates technology in a high-skilled area.

To illustrate, rack systems and methods for processing manufactured products are explained below in conjunction with the drawings. FIG. 1A illustrates a rack system 100 with a rack 101 according to one embodiment. Such rack system 100 can be operated by a person who is unskilled in the skilled area of technology. For example, the rack system 100 can be operated by a manufacturing plant operator unskilled in the area of microwave technology. Hence, such rack system 100 may be installed at a contract manufacturer's facility and operated by less skilled persons with little training for operating and maintaining it. The rack system 100 may be associated with a rack identifier, a part number, a serial number, or any other combination of one or more numbers, characters, or the like. The rack identifier may be attached to the rack 100, for example, in the form of a label, bar code, or the like.

The rack system 100 typically includes the rack 101 with a frame 102, plates 104a-f, shields 106a-f, an adapter 116, and a detector 118. The frame 102 may be formed as a skeleton structure or any other suitable structure. The frame 102 may include a frame bottom 108 and a carrier 114. The carrier 114 may be attached to the frame bottom 108 or the frame body may be resting on the carrier 114 with its bottom touching the carrier 114. The carrier 114 may have wheels, gliders or legs. In one embodiment, the wheels may be castors. The rack 101 may be made, in whole or in part, from rigid materials such as metal or plastic. Any part that needs to be conductive may be made of aluminum, steel or any other suitable material. Any part that needs to be non-conductive may be made of plastic, wood or any other suitable material.

The plates 104a-f may be coupled to the frame 102 on each side of the frame 102 facing outwards 110a-b and inwards 112a-b. In the illustrated embodiment, plates 104a-c are coupled to the frame on one side 110a and plates 104d-f are coupled to the other side 110b. The shields 106a-f are coupled to the frame on the sides of the frame, both of which are interior sides, i.e., facing inwards 112a-b and opposite to the corresponding plates 104a-f. For example, shield 106a may be coupled to the frame 102 on the interior side 112a opposite to the corresponding plate 104a.

A plate 104 is typically configured for an operating mode. The operating mode may include any one or a combination of an operating frequency range, a wavelength, a type of fiber design and a core diameter (e.g., of an optical fiber). The operating mode may correlate to or may be obtained via direct or indirect correlation with a serial number, a part number, a product identifier, a customer identifier, or any combination thereof. The operating mode may additionally or alternatively be an angle of mounting a unit on a plate 104. In this rack system embodiment, the plates 104a-f are configured for the same operating mode (although they may be configured differently in other embodiments). Such operating mode may be, for example, a 7 GHz operating frequency vertical mounting mode.

Mounting of a unit on a plate 104 preferably imitates field installations and may simulate field use and environment. For example, an outdoor unit of a split-mount microwave radio system may be mounted on a plate 104 as it would in its normal commercial installation. One such installation may require an angle of mounting to imitate horizontal or vertical polarization. Such angle may be predetermined. For example, an angle of 180° relative to ground may be selected to imitate a vertical field mounting of the unit. In another embodiment, the angle of 90° relative to ground may be selected to imitate a horizontal field mounting of the unit. In some embodiments, imitating field environment may include imitating air flow or other field use conditions. The air flow conditions may imitate air flow around the unit in the field or air flow between various units in a single installation.

Typically, units of various manufactured products include technology in a skilled area. Such technology may include microwave radio technology, fiber optic technology, acoustic technology or any combination thereof. Thus, a unit, such as an outdoor unit of a split-mount microwave radio system, has a configuration particular to it. The configuration may accommodate an operating frequency, wavelength, etc. Indeed, the configuration may accommodate various product operating modes.

As will be later described in more detail, the structure of the shields 106a-f is designed to mitigate interference that tends to be generated by or may affect various units when mounted on the rack 101 and processed in close proximity to each other. Interference may include electrical interference, electromagnetic interference (EMI), or both. During processing, such interference may also occur between various units mounted on different racks located in close proximity to each other. For example, different racks may be located in the same temperature chamber.

In this rack system configuration, the adapter 116 functions as a hub of operating signals for processing units. Thus, the adapter 116 is operative to communicate operating signals to and from a unit when mounted on a plate 104. In some embodiments, such operating signals may be communicated to and from a system external to the rack 101 (remote system not shown). For example, the external system may be a test system and the operating signals may include test signals. The adapter 116 may include connector(s) for conveying the operating signals. The connectors may include coaxial cables. The kind of unit to be processed may affect the type of communication, operating signals, connectors, cables, optical fibers, etc. used in conjunction with the rack system 100. For example, when a unit includes fiber optic technology, the adapter 116 may be configured for fiber optic operating signals and the connectors may include optical fiber connectors. In some rack system embodiments, the adapter 116 may include an adapter panel 900 (FIG. 9A) operatively coupled to the frame 102, the frame bottom 108, or both.

Each of the connectors may have a connector mode. Examples of connector modes include an operating frequency range or an operating wavelength. Furthermore, a connector identifier, a type of fiber design, a part number, a serial number, a customer number or any combination thereof may be correlated directly or indirectly to a connector mode.

As mentioned, the rack system 100 may be provided with a detector 118. The detector 118 may be fixedly or removably attached to the rack 100. The detector 118 may be operative to obtain identifying information from the various units and plates. Identifying information helps determine whether there is a match between the configuration of a unit and the operating mode of a plate 104 on which such unit is to be mounted. The identifying information may further help determine whether there is a match between such unit configuration and the connector mode of the connector. The detector 118 may be therefore adapted to determine whether there is a match by comparing the identifying information associated with a unit, a plate 104, the connector, or any combination thereof. For example, the detector 118 may determine that a match exists if a unit, a plate 104 and a connector are all adapted for the same particular operating mode (e.g., the same operating frequency range).

To this end, the detector 118 may include a data retrieval device 122, a processor 124 and a memory 126. The data retrieval device 122 may be configured to obtain data associated with the particular rack 101, a plate 104, a unit, a connector, or any combination thereof. The data retrieval device 122 may include one or more of a scanner, a bar code reader, a keyboard, a key pad, a pointing device, and a voice recognition device.

The processor 124 may be operative to receive data, such as data obtained using the data retrieval device 122 and, in response to program instructions, to determine whether or not processing of a unit can proceed or should be barred. Such determination is based on a comparison between the obtained data and predetermined matching information. The predetermined matching information includes matches between a rack, a unit, a plate and a connector, in any combination, and a match can be in terms of identifier, configuration and operating modes. The processor 124 may be integral to or coupled to the detector 118.

The detector 118 may also have a memory 126 operative to store the rack identifier, the configuration of various units, the operating mode (of plates), the connector modes, predetermined matches, in any form or variation thereof. The memory 126 may be configured for storing program instructions to be executed by the processor 124. In some embodiments, one or more of the data retrieval component 122, the processor 124, and the memory 126 may be operative to receive commands from an external system.

Also, in some embodiments, one or more components of the detector 118 (e.g., the data retrieval device 122) may be automated, i.e., require input or supervision by an operator. Alternatively, one or more components of the detector 118 may be automatic, i.e., require no input or supervision by the operator. As a further alternative, one or more functions of the detector 118 may be performed manually. For example, obtaining data associated with a plate 104 may be performed by visual inspection of a bar code, label, or other identifier attached to such plate. Furthermore, storing obtained data may be performed manually (by the operator), automatically (e.g., via program instructions executed on the processor 124), in an automated fashion (e.g., via keyboard entry or other input device used by the operator), or any combination thereof.

Figure 1B:
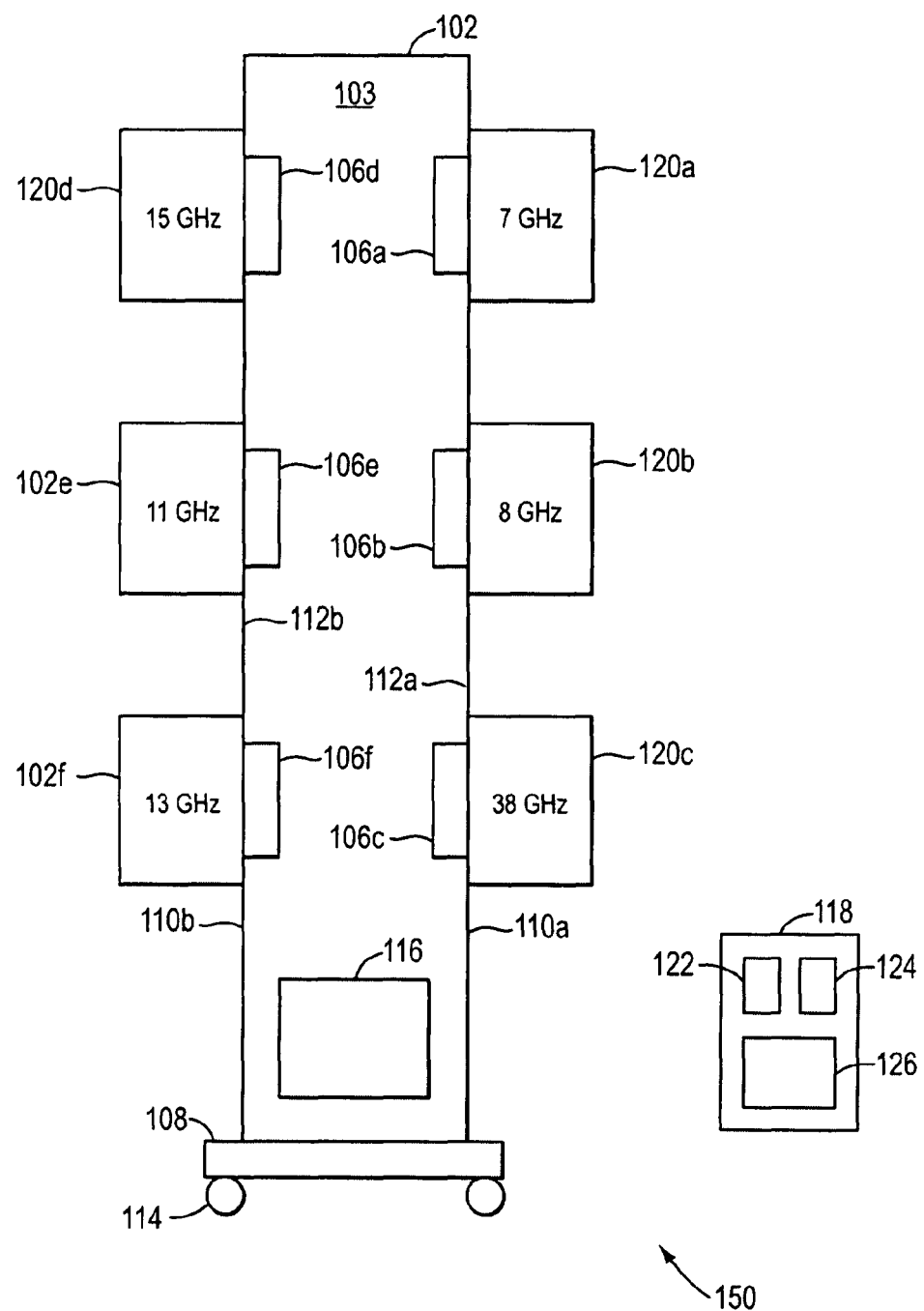

Having described one, FIG. 1B illustrates another rack system embodiment (and components it has in common with the foregoing embodiment are typically called out by similar numbers). This rack system 150 comprises a rack 103 with a frame, such as frame 102, the frame bottom 108, plates 120a-f, the shields 106a-f, the carrier 114, the adapter 116, and the detector 118. The detector 118 may include the data retrieval device 122, the processor 124, and the memory 126. In this embodiment, the plates 120a-f may be configured for various operating modes (as opposed to all being the same). For example, the plates 120a-f may be configured for various operating frequencies, such as 7 GHz, 8 GHz, 38 GHz, 15 GHz, 11 GHz, and 13 GHz, respectively. Other combinations of operating modes, number of plates 120, etc. are possible.

Figure 2A:
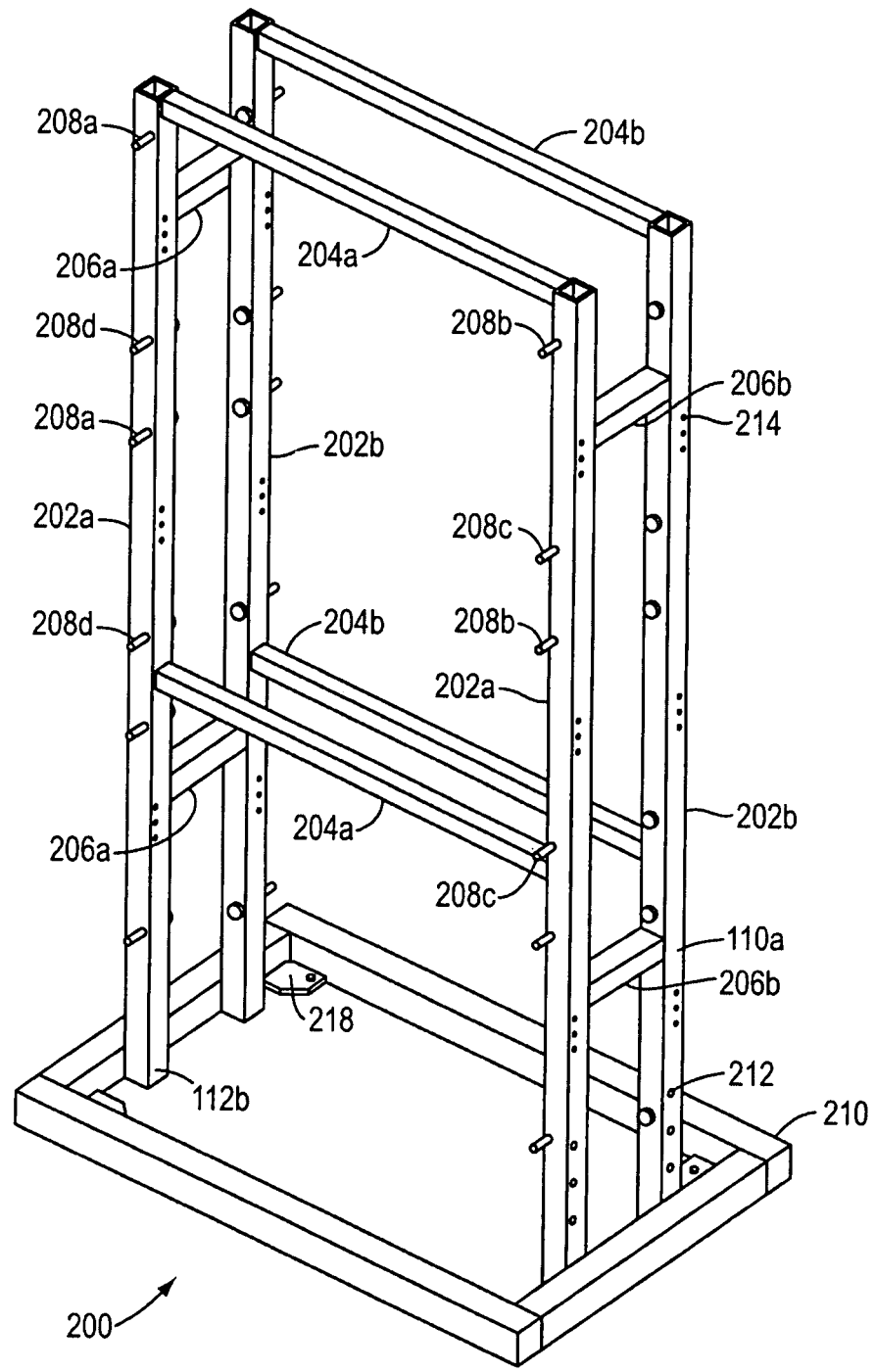
FIGS. 2A-C show different views of a frame of a rack according to one embodiment.
Figure 2B:
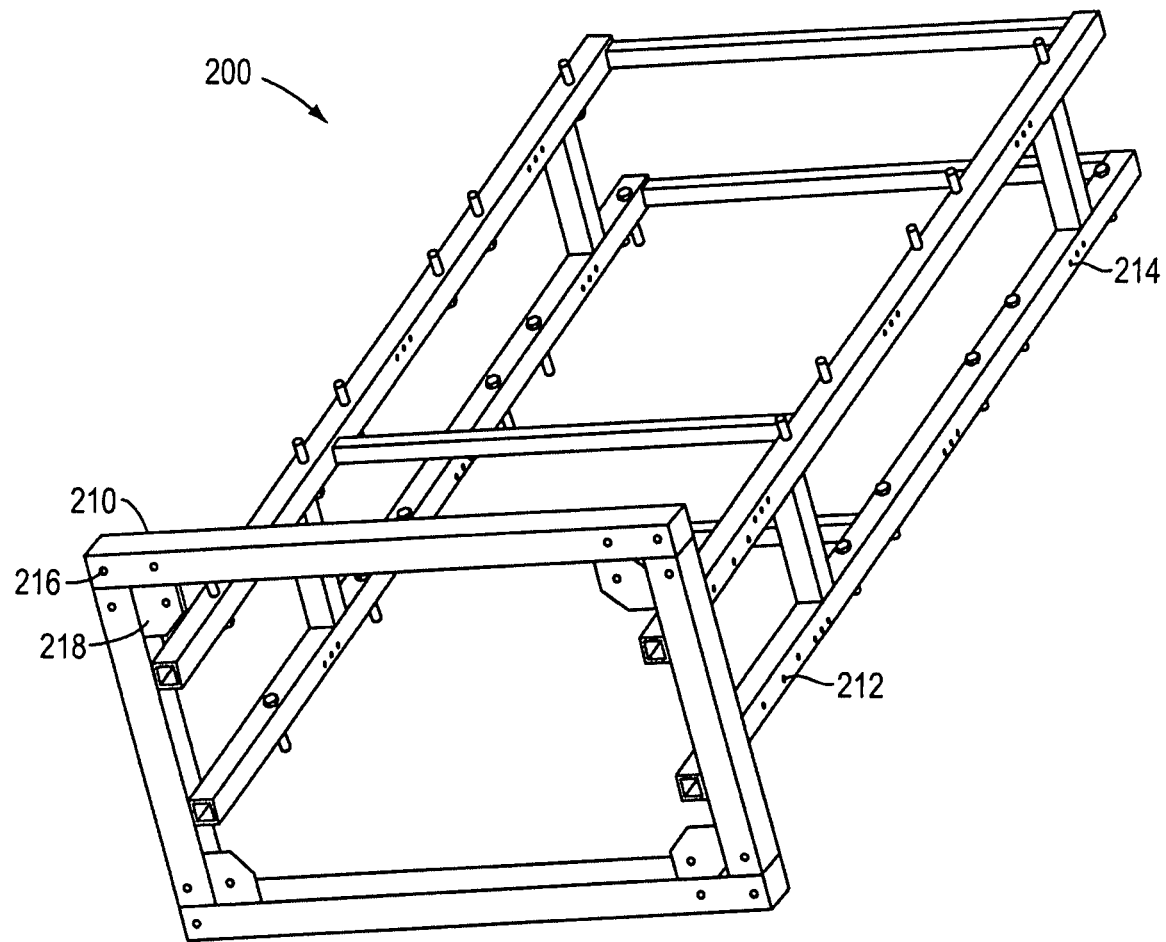
Figure 2C:
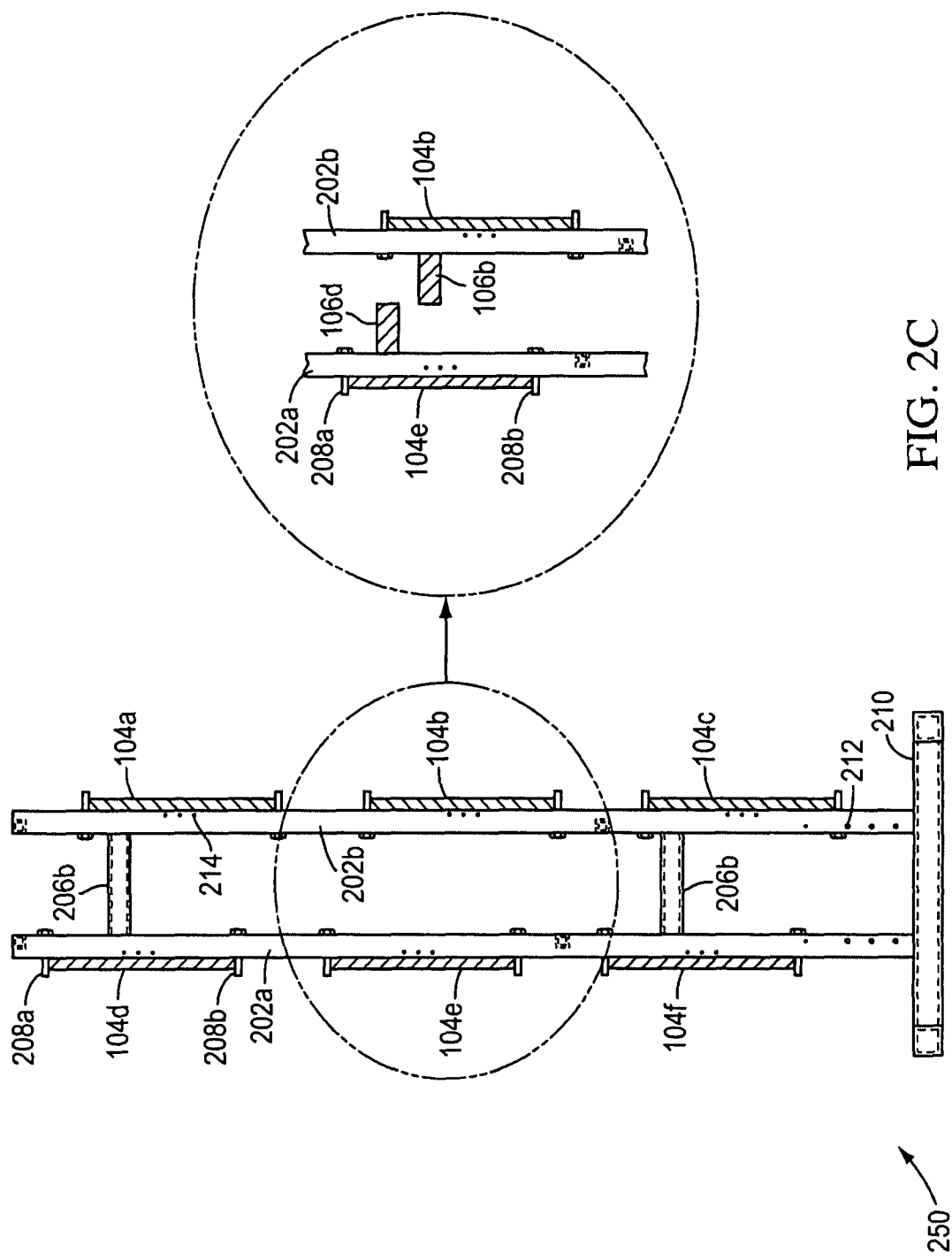

As to the frame, a number of possible configurations are possible, one example being a skeleton frame structure. In some embodiments, the frame may be made in part or entirely of rigid and conductive materials. FIGS. 2A-C show different views of a frame according to one embodiment (e.g., frame of rack 101 or 103). FIG. 2A illustrates a perspective view of the frame 200. The frame 200 comprises, respectively, front and rear posts 202a-b, front and rear lateral members 204a-b, and left and right members 206a-b. The front lateral members 204a are operative to couple the front posts 202a to each other. Likewise, the rear lateral members 204b are operative to couple the rear posts 202b to each other. The left and right members 206a-b are operative to couple the front posts 202a to the rear posts 202b. The coupling between posts is typically mechanical to provide rigidity. The mechanical connections may be implemented in various ways, as commonly known.

In the illustrated embodiment, each of the members 204a-b, 206a-b includes an upper and a lower member. Other embodiments may include fewer or more members. For example, one embodiment may include three front lateral members 204a (e.g., an upper, a lower and a center member). A further embodiment may include a single left member 206a and a single right member 206b.

The frame 200 may further comprise plate mounting studs 208a-d (two sets of studs are shown, upper and lower, but there may be room for other sets of studs for mounting additional plates). In each set, the plate mounting studs 208a-d mate with a plate, as it is mounted on the frame 200. In the illustrated embodiment, the frame 200 is configured for mounting up to six plates 104 (e.g., plates 104a-f), with each plate 104 being mounted to the rack frame 200 via four plate mounting studs 208a-d. In other embodiments, each plate 104 may be mounted using more or fewer plate mounting studs 208. In yet other embodiments, the frame 200 may allow for mounting more or fewer than six plates 104. The plate mounting studs 208 may be fastened to the frame 200 with bolts or other known fasteners (not shown).

The frame 200 may further include a frame bottom 210 and gussets 218. The frame bottom 210 may be coupled to one end of each of the front and rear posts 202a-b. The gussets 218 may be formed as plates, and each of the gussets 218 may be coupled to one corner of the frame bottom 210. The gussets 218 are typically used to add strength to the frame 200, for example, by reinforcing the corners of the frame bottom 210.

The frame 200 may also include mounting holes. The mounting holes may include one or more of adapter mounting holes 212 and connector mounting holes 214. The adapter mounting holes 212 are operative to couple an adapter plate (item 900 in FIG. 9) to the frame 200. In the embodiment illustrated in FIG. 2A, the adapter mounting holes 212 are located in the front and rear posts 202a and 202b, respectively, on the right side of the plate. The connector mounting holes 214 are operative to couple (e.g., affix) the connectors (not shown) to the frame 200.

FIG. 2B illustrates a perspective view of the frame 200 from a different angle. This view shows one possibility of coupling the gussets 218 to the frame bottom 210. The frame 200 may also include carrier mounting holes 216 operative to couple the carrier 114 to the frame bottom 210. In some embodiments, the frame 200 may include more or fewer than the mounting holes 212, 214, 216 illustrated in FIGS. 2A-B.

FIG. 2C illustrates a side view of a rack frame 250. In this embodiment, the frame 250 is configured to mount plates 104 asymmetrically, i.e., offset from each other, or staggered. That is, plate mounting studs 208 on the front and rear posts 202a and 202b, respectively, are offset. One possible advantage of such asymmetric configuration is that the frame 250 may be constructed with shorter left and right members 206a-b than it would be in a symmetric configuration (such as that illustrated in FIG. 2A). A symmetric configuration accommodates the full depth of two shields facing but not touching each other, whereas the offset in an asymmetric configuration may obviate this requirement.

Figure 3:
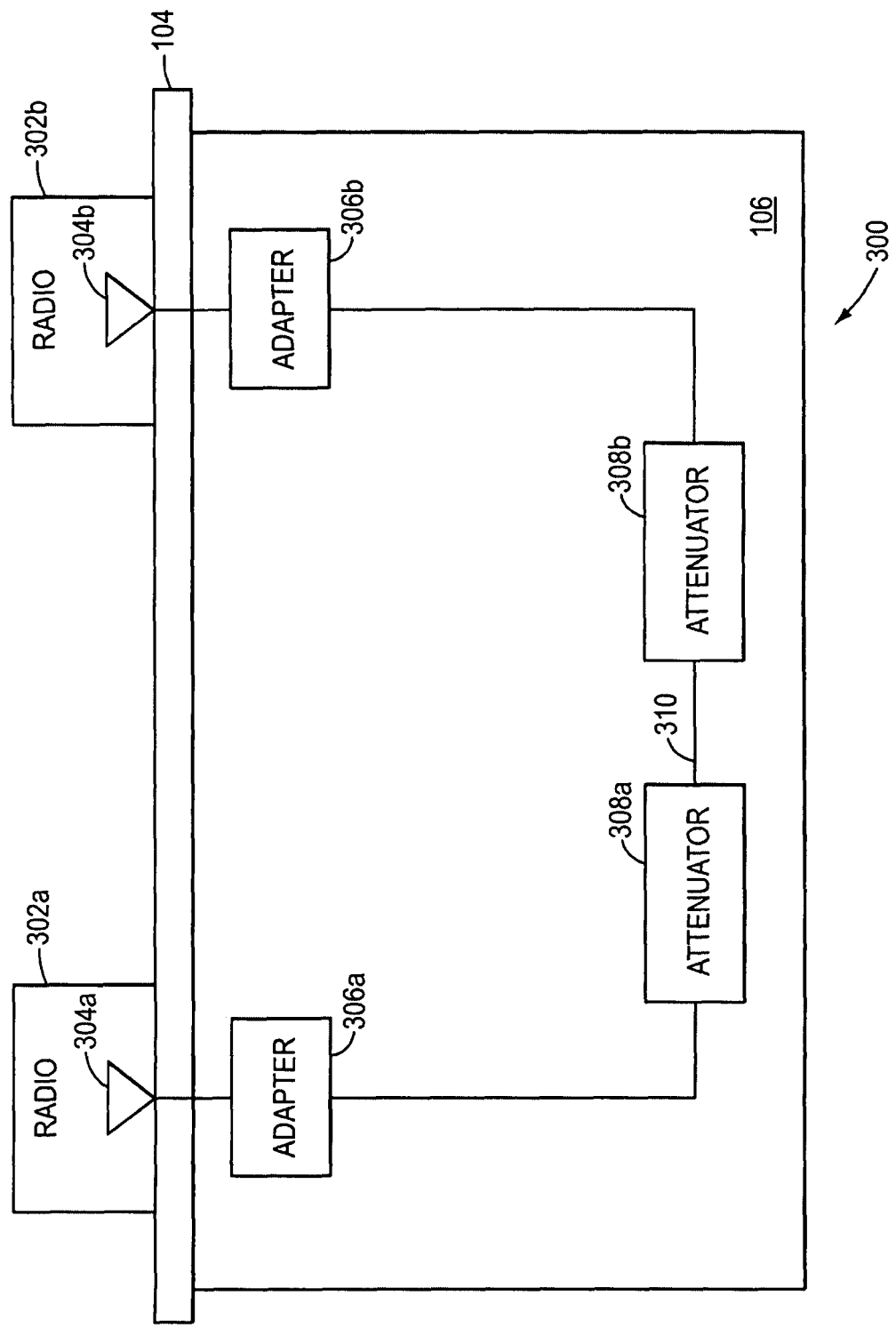
FIG. 3 illustrates a block diagram of a plate system according to one embodiment.

FIG. 3 is a block diagram of a plate system 300 according to one embodiment. In this embodiment, a plate 104 is configured to carry (or hold) two units 302a-b. This configuration allows the two units 302a-b to be mounted on the same plate and to communicate with each other during processing. This configuration may imitate field use conditions of a communication system (not shown) such as a point-to-point wireless communication system. Accordingly, the plate system 300 comprises a plate (e.g., plate 104a), a shield 106 (e.g., shield 106a), two units 302a-b and interfaces 304a-b. The units communicate with each other via an interface which is preferably enclosed by the shield. To this end, the shield 106 may house unit adapters 306a-b, attenuators 308a-b, and a shield connector 310 in order to allow the units 302a-b to communicate with each other substantially without interference. Each of the two units 302a-b mounted on the plate may be operatively coupled to its respective interface 304a-b. Each interface 304a-b may in turn be operatively coupled to the respective unit adapter 306a-b and attenuator 308a-b via the shield connector 310.

As noted, the units 302a-b may include radios 302a-b, such as outdoor units of a split-mount microwave radio system. The radios 302a-b may be operative to receive and transmit signals. During operation of the plate system 300, such as during processing of the radios 302a-b, one radio (e.g., radio 302a) may be configured to transmit signals and the other radio (e.g., radio 302b) may be configured to receive signals. In this case, the shield 106 is operative to mitigate interference with signals transmitted between radios 302a-b. The interference is generated, for example, by other units (not shown) mounted on an adjacent plate which are processed substantially simultaneously as the radios 302a-b. The adjacent plate may be mounted on the same rack as the plate 104 or on another rack located in the same processing chamber.

The interfaces 304a-b that provide points of interconnection to the two units mounted on the plate 104 may imitate interconnection to a network. The nature of the network may depend on the technology incorporated into the units. The network may be a wireless communication system, a microwave radio network, a fiber optic network, an acoustic network or the like. The interfaces 304a-b may be configured for a particular operating mode. Thus, interfaces 304a-b configured for a plate 104a that has one operating mode may be different from interfaces configured for another plate 104b that has a different operating mode. In some embodiments, the interfaces 304a-b may be configured such that a unit having a configuration incompatible with the operating mode of the plate cannot be mechanically and/or electrically coupled to such interface 304a-b. An interface 304a-b may be a waveguide interface (as described in further detail with reference to FIG. 5).

The unit adapters 306a-b are typically used for matching signals to the characteristics of the units such that an operative connection may be made within the shield 106 between the two units 302a-b. The unit adapters 306a-b may be operative to convert a signal in one form associated with a first medium to a signal in another form associated with a second medium. The first medium may be a wireless medium (e.g., air), a fiber optic medium, an acoustic medium, or the like. The signal whose signal form is converted may be an electromagnetic, optical or acoustic signal. The second medium may be a wire (e.g., a coaxial cable or an optical fiber). The shield connector 310 may include the second medium. In one embodiment, the unit adapters 306a-b may be waveguides or transducers 306a-

*b.* In other embodiments, the unit adapters 306*a-b* may be piezoelectric acoustic wave filters or fiber optic converters.

Because the unit adapters 306*a-b* can be coupled to the rack, it tends to save the step of an operator attaching a unit adapter to a unit prior to processing it and the further step of detaching the unit adapter following completion of such processing. This avoids human errors and saves time, and it may also avoid possible damage to the unit, the unit adapter 306, or both.

The attenuators 308*a-b* are typically operative to reduce the amplitude or power of a signal transmitted between the two units without substantially distorting such signal. The attenuators 308*a-b* may be passive or active devices. Passive devices can include resistors. Examples of attenuators 308*a-b* are power attenuators and electrical attenuators. The attenuators 308*a-b* may be adapted to provide an amount of attenuation that is fixed, continuously adjustable, or incrementally adjustable.

Note that although in this embodiment two units 302*a-b* are mounted on a plate 104 for processing, in another embodiment, a single unit may be mounted on the plate. An example is a medical device designed to operate alone. Such medical device may nonetheless cause or be susceptible to interference during processing (e.g., from medical devices mounted on adjacent plates) and will be installed with a shield. In yet other embodiments, more than two units of manufactured products (e.g., 302*a-c*) may be mounted on a plate. An example is units designed for a power supply network (e.g., a supply grid for a geographic area). Another example is units designed for an acoustic system with units for listening and units (e.g., speaker systems) for playing sound (e.g., broadcasting, multicasting) sound to the listener(s).

Figure 4A:
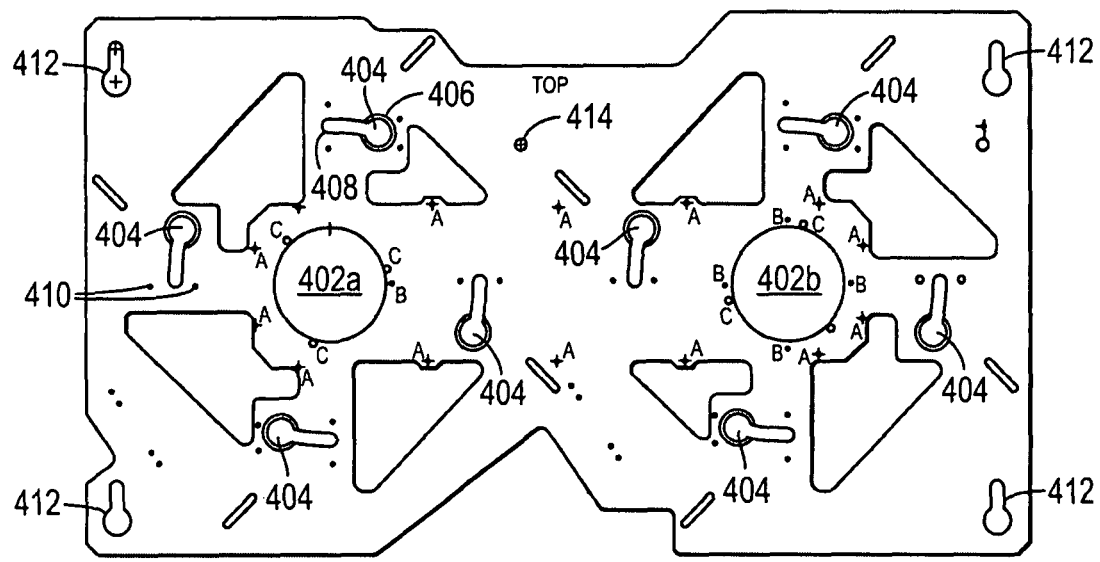
FIGS. 4A and 4B illustrate, respectively, front and back views of a plate according to one embodiment.
Figure 4B:
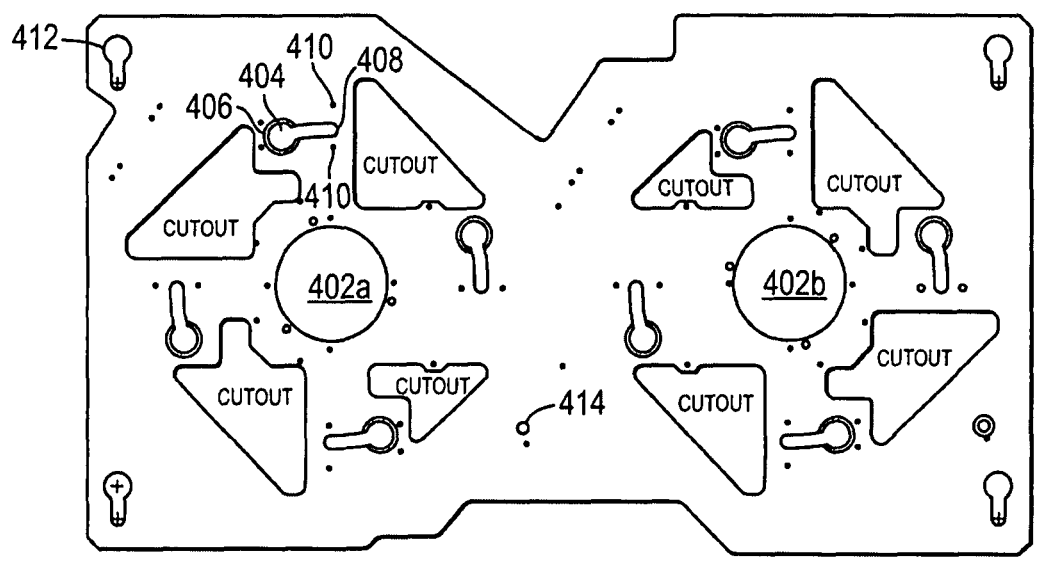
Figure 7:
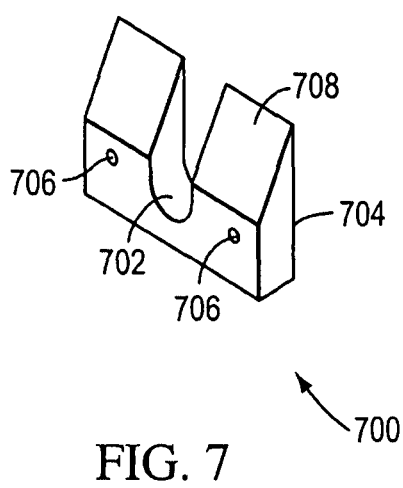
FIG. 7 illustrates a ramp portion of an attachment mechanism on a plate according to one embodiment.
Figure 8:
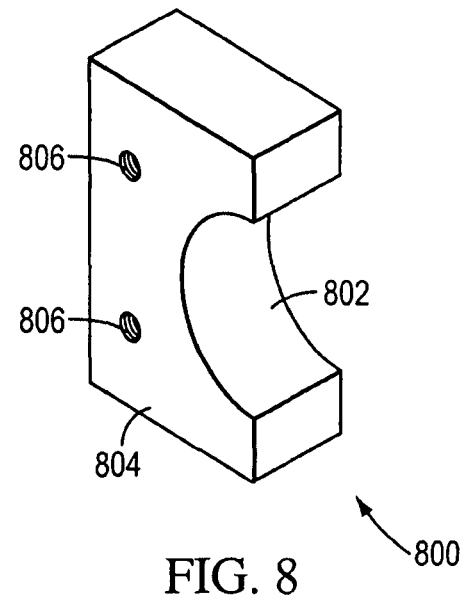
FIG. 8 illustrates a stop portion of an attachment mechanism on a plate according to one embodiment.

FIGS. 4A and 4B illustrate, respectively, front and back sides of a plate adapted to accommodate two units (e.g., the radios 302*a-b*) according to one embodiment. Depending on plate orientation, the front and back sides may be come top and bottom sides, respectively. In this instance, the plate 104 comprises interface openings 402*a-b*, stud insert openings 404, plate mounting holes 412, 414 and ramp mounting holes 410 (e.g., ramp mounting holes 706 of FIG. 7). Each of the interface openings 402*a-b* is configured for receiving interfaces 304, 306. The stud insert opening 404 has an insert end 406 and a stop end 408. The insert end 406 is configured with a dimension to match a ramp (e.g., ramp 700 with a diameter of its inner ramp surface 702, as shown in FIG. 7). The stop end 408 is configured with a dimension to match a stop (e.g., a stop 800 with a diameter of its inner stop surface 802, as shown in FIG. 8). The ramp 700 and stop 800 are parts of the unit attachment mechanism and will be described in further detail with reference to FIGS. 7 and 8.

Correspondingly, a unit with mounting studs requires, for each stud, a stud insert opening configuration (e.g., 404) for allowing insertion of a mounting stud at the insert end 406 and for turning the unit until the mounting stud reaches the stop end 408 and comes to rest on the stop 800. Note that the size and number of the stud insert openings 404 may vary depending on the kind of unit to be mounted on the plate, including its number and size of mounting studs.

The plate mounting holes 412 may be placed anywhere suitable for attachment a plate to the frame; e.g., perimeter, corners, center, or any other place. The plate mounting holes 412 may be adapted for any suitable type of fasteners for attaching a plate to the rack frame. Some embodiments may additionally or alternatively include plate mounting holes 414 disposed at or around the center of the plate 104. The plate mounting holes 412, 414 may be adapted for fasteners such as rivets, screws, bolts or the like. Other types of plate mounting holes 412, 414 may be used. The plate may also include various cutouts, openings, holes and the like for purposes such as but not limited to affixing the plate to the frame, heat dissipation, etc.

As mentioned, the interfaces (304*a-b*, FIG. 3) for operatively connecting the units may be waveguide interfaces. A waveguide interface 500 is adapted for an operating frequency range, e.g., 6-11 GHz or 13-38 GHz, where the operating frequency determines the configuration of such waveguide interface. FIGS. 5A-5H illustrate various interfaces, with part 1 showing a side view, part 2 showing a front view, part 3 showing a rear view, and so on, and with the different configurations suited for handling different frequency ranges.

In part 1 of FIGS. 5A-5H, for instance, the waveguide interface 500 is shown having a rim 502, a center portion 506, and a rear portion 504. The center portion 502 may be configured for coupling it to or resting it to on the plate 104. The rear portion 504 may be configured for mating it with a unit. The rim 502 may also provide points of mechanical attachment to the unit. The waveguide interface 500 may further include waveguide interface plate mounting holes 512 and unit mounting holes 514.

The waveguide interface 500 may be configured such that a mismatched unit cannot be coupled to it. For example, the size of the rim 502 may have dimensions (e.g., a diameter) permitting only a matching unit to be mechanically coupled to the waveguide interface 500. As illustrated in parts 2 and 3 (front and rear views) of FIGS. 5A-5H, the waveguide interface 500 typically includes a duct 508. The size and shape of the ducts 508 allows a matching unit to be coupled to the waveguide interface 500.

Based on the frequency range (e.g., 6-11 GHz, 13-38 GHz etc.) the duct 508 may have dimensions d1 and d2, as shown. Examples of dimensions d1 and d2 include 34.85 mm and 15.8 mm, 28.5 mm and 12.62 mm, 22.86 mm and 10.16 mm, 15.8 mm and 7.9 mm, 10.6 and 4.32 mm, 7.11 mm and 3.56 mm, and 19.05 mm and 9.53 mm, respectively. Implementations of the waveguide interfaces 500, 550 may differ in other dimensions as well. For instance, the thickness of the rim 502, rear portion 506 or center portions 504 may vary.

As shown in part 4 of FIGS. 5A-5H, the cross-section view of the waveguide interface 500 illustrates the front portion 502 formed with an angle $\alpha$. As the unit is inserted, the angle $\alpha$ tends to align the unit centrally into the waveguide interface 500. In one embodiment, the angle $\alpha$ may be 27 degrees.

Figure 6A:
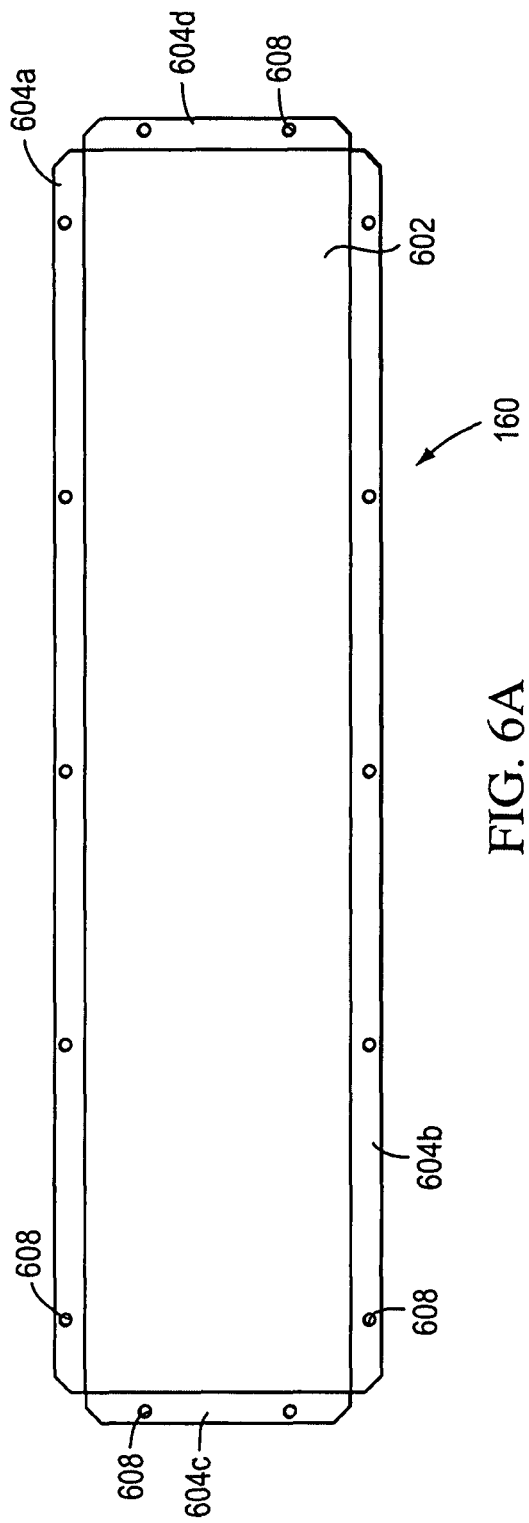
FIGS. 6A and 6B illustrate, respectively, top and side views of a shield according to one embodiment.
Figure 6B:
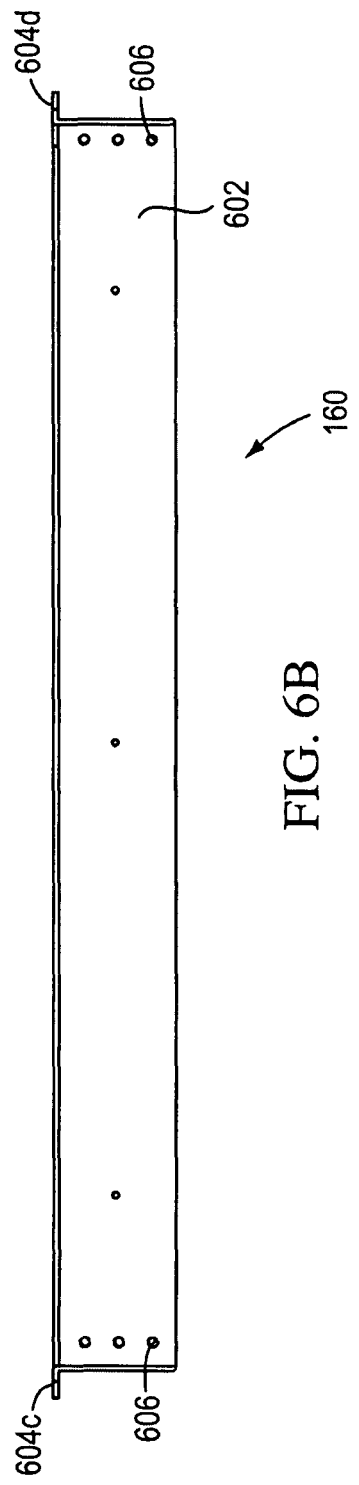

FIGS. 6A and 6B illustrate, respectively, top and side views of a shield, e.g., 160, according to one embodiment. The shield 160 comprises a housing 602 and flanges 604*a-d*. The shield may further include corner fasteners 606 and shield mounting holes 608. The flanges 604 may be projections of or may be coupled to the housing 602 and configured to allow coupling of the housing 602 to the plate 104. In some embodiments, the corner fasteners 606 may include rivets. In other, differently shaped embodiments, the corner fasteners 606 may be omitted. The shape and materials of a shield 160, as well as its coupling configuration, depend on the shape of a unit, the type of technology incorporated into such unit, and the like.

Going back to the unit attachment mechanism, FIG. 7 illustrates a ramp portion (ramp 700) of an attachment mechanism according to one embodiment. The ramp 700 may comprise a contoured ramp surface 702, a ramp mounting surface 704, and one or more ramp mounting holes 706 (e.g., ramp mounting holes 410 of FIG. 4A). The contour of the ramp surface 702 is configured for receiving a mounting stud attached to a unit. The ramp 700 is configured so that, after insertion, a mounting stud scales the ramp surface 702. The ramp mounting surface 704 is used for coupling the ramp 700 to a back (or bottom) surface of the plate 104 with the ramp mounting holes 706 configured to receive fasteners for coupling the ramp to the plate. The ramp 700 may further include a graded surface 708 configured to facilitate removal of the mounting studs upon completion of unit processing when the unit is demounted. For example, the graded surface 708 may be designed to make it easier for the operator to reach (e.g., get a firm grip around) the mounting studs.

FIG. 8 illustrates a stop portion of the aforementioned attachment mechanism according to one embodiment. A stop 800 may comprise a contoured or graded inner stop surface 802, a stop mounting surface 804, and one or more stop mounting holes 806. The stop mounting surface 804 may be configured for coupling it to the back surface of the plate 104. The contoured inner stop surface 802 is configured for causing a mounting stud to come to a stop upon being turned in the inner ramp surface 702. The stop 800 may be further configured, alone or in conjunction with the ramp 700, to lock a unit in place when mounted on the plate 104. Locking may include causing a unit to come to a stop (with its mounting studs resting in their respective ramp 700) and stay secure in place during processing (without the aid of an additional fastener or lock mechanism).

Figure 9A:
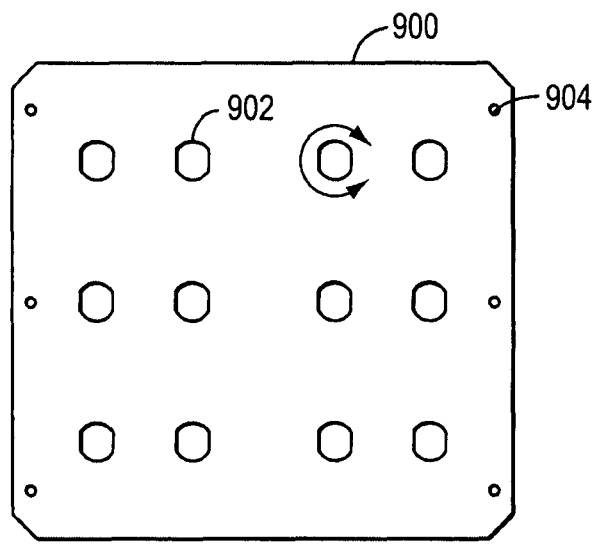
FIGS. 9A and 9B illustrate an adapter panel of an adapter according to one embodiment.

Turning now to the aforementioned adapter, FIG. 9A illustrates an adapter panel of an adapter (e.g., the adapter 116) according to one embodiment. The adapter panel 900 comprises one or more connector openings 902 and one or more adapter panel mounting holes 904. In one embodiment, the adapter panel 900 may include one connector opening 902 for each unit of manufactured product mounted on the rack. For example, a rack system comprising six plates, each configured to process two units of manufactured product, may include an adapter panel 900 with at least twelve connector openings 902. The number, size and locations of the adapter panel mounting holes 904 may be commensurate with the number, size and locations of the adapter mounting holes 212. Additional connector locations may be provided for external system connections.

Figure 9B:
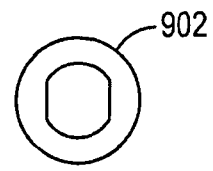

FIG. 9B illustrates a shape of a connector opening 902 according to one embodiment. Other sizes and shapes of the connector opening 902 are possible depending, for example, on the type of technology incorporated into a unit. In one embodiment, the connector opening 902 may be configured for receiving a coaxial cable. In another embodiment, the connector opening 902 may be configured for receiving an optical fiber.

Figure 10:
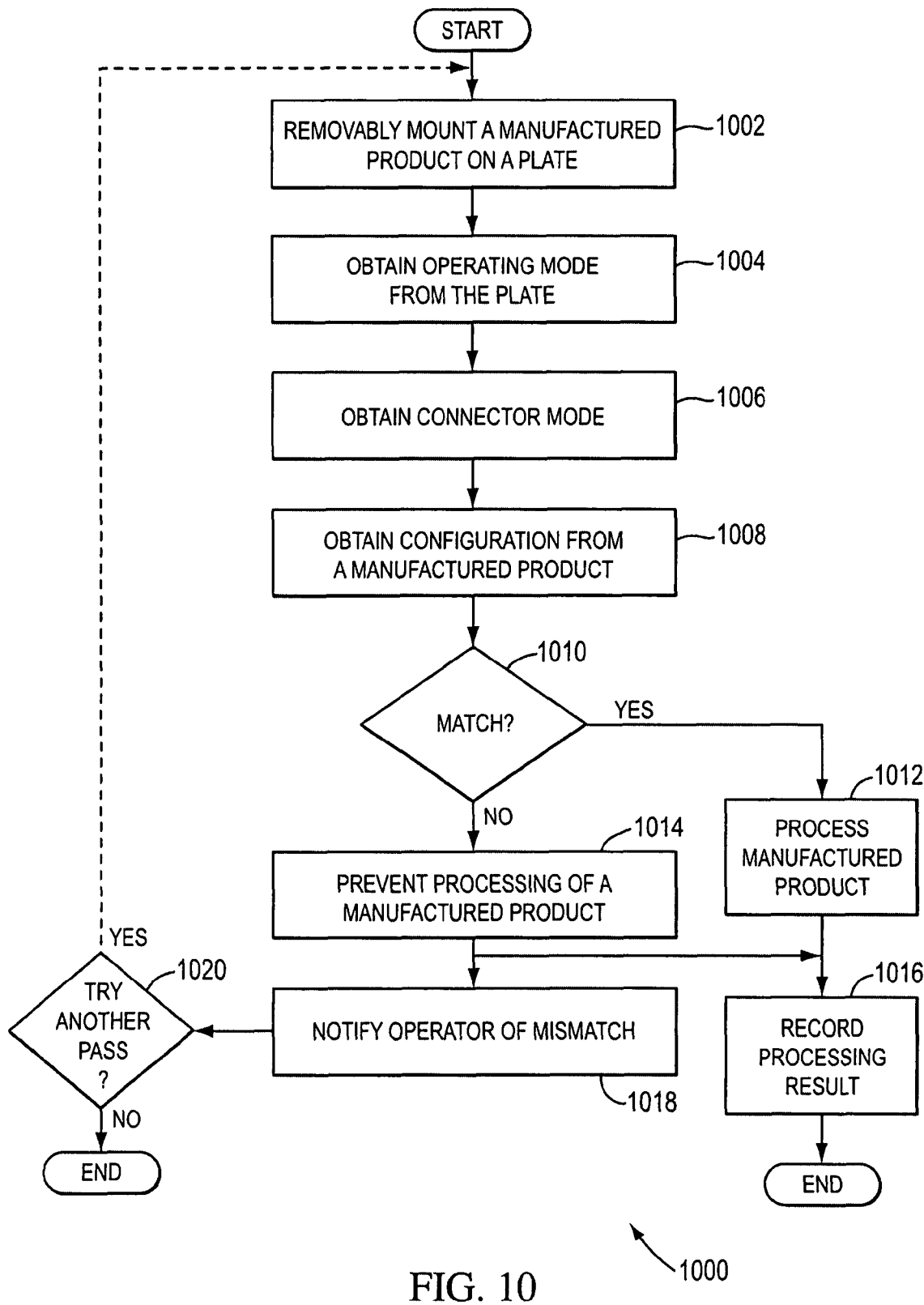
FIG. 10 is a flow diagram of a method for processing a manufactured product according to one embodiment.

As to the manufacturing method, FIG. 10 is a flow diagram of a method using a rack system as described above for processing a manufactured product according to one embodiment. The method 1000 begins at step 1002 with an operator removably mounting a unit of manufactured product on a plate. Step 1002 may include inserting one or more mounting studs of a unit into an insert end (ramp opening). The unit with one or more mounting studs may then be turned until the studs reach a respective stop end. Upon completion of step 1002, the unit is locked into place on the plate.

In some embodiments, removably mounting may include removably mounting multiple units of manufactured product. For example, a pair of radios may be mounted on a plate. In some embodiments, removably mounting may include removably mounting one or more units of manufactured product on multiple plates (e.g., the plates 104*a-f*). At step 1004, the operating mode is obtained from the plate 104. At step 1006, the connector mode associated with the connector coupled to the adapter 116 is obtained. At step 1008, the configuration is, obtained from a unit of manufactured product. One or all of steps 1004, 1006 and 1008 may be performed manually (e.g., by visual inspection of a label attached to the plate, the connector or a unit), automatically (e.g., by using a detector), in an automated fashion (e.g., by keyboard entry), or any combination thereof. One or more of the operating mode, the connector mode and the configuration may be obtained indirectly. This may involve deriving the configuration from a product number or serial number of the unit by looking it up in a table or other configuration listing (e.g., in memory).

The order of these steps may change. For example, in some embodiments, one or more of steps 1004, 1006 and 1008 may be performed prior to step 1002. The configuration may, for example, be obtained from a unit before the unit is mounted on the plate. In such an embodiment, step 1008 is performed prior to step 1002.

At step 1010, a determination is made whether a match exists. Step 1010 may include comparing one or more of the operating mode of the plate 104, the connector mode, and the configuration of a unit with predetermined matching information (e.g., matching table entries). In one embodiment, the determination may be performed by the processor 124 in response to program instructions.

If, at step 1010, a match is determined to exist, the method 1000 may continue with step 1012 at which a unit is processed. If, at step 1010, a mismatch is found, the method 1000 may continue with step 1014, at which processing of the unit is prevented.

The method 1000 may also include a step 1016 at which a processing result may be recorded. Step 1016 may follow successful or unsuccessful processing of a unit (at step 1012) including when processing is prevented. Recording the processing result may include storing data to a memory associated with the rack system (e.g., memory 126 or external memory which is not shown). Recording may further include printing data to a printing device, manually recording data or recording it in an automated fashion (e.g., entering the data to a computerized device via a keyboard). Upon completion of step 1016, the method 1000 may end.

The method 1000 may further include a step 1018 at which the operator is notified of a mismatch. Notifying the operator may include displaying a code, color, or text message, for example, on a display (e.g., on a display included in the detector 118 or in a system external to the rack). Upon being notified of the mismatch, the method 100 may, at step 1020, attempt another pass at processing the unit. The operator may, for example, be prompted (e.g., on the display) to indicate whether or not to try another pass. If the choice, at step 1020, is to try another pass, the method 1000 may return to step 1002. If not, the method 1000 will end.

Other embodiments of the method 1000 are possible. For example, upon choosing not to try another pass, the method 1000 may include a step 1022 at which a non-matching unit is replaced. In such an embodiment, the method may thereafter return to step 1002.

In some embodiments, parts or all of steps 1014 and 1018 may be performed in a different order. For example, the operator may, at step 1018, be notified that a mismatch exists. Thereafter, the operator may, at step 1014, prevent processing of the unit by omitting to push a start button.

One or more steps in the method 1000 may be optional. Step 1004 may, for example, be optional if the operating mode was obtained previously (e.g., during a prior pass) and stored to memory 126. Likewise, steps 1006 and/or 1008 may be optional, such as if the connector mode and/or the configuration were obtained previously.

Figure 11:
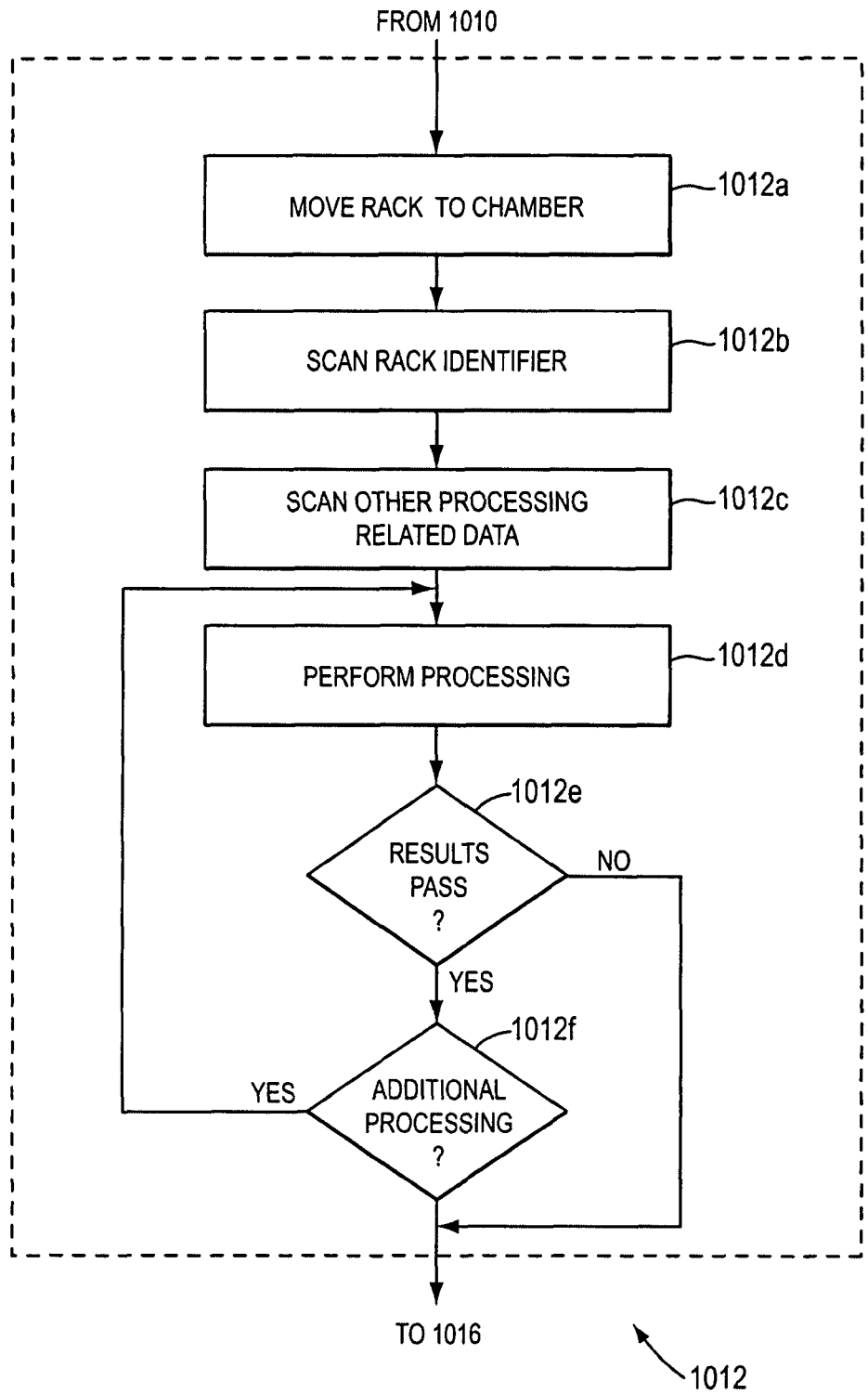
FIG. 11 is a flowchart illustrating the step of processing a manufactured product according to one embodiment.

FIG. 11 is a flowchart illustrating step 1012 of the method above according to one embodiment. In this embodiment, step 1012*a* involves moving the rack system to the processing chamber. At step 1012*b*, the rack identifier is obtained. The rack identifier may, for example, be scanned. In some embodiments, step 1012*b* may be performed prior to step 1012*a*, for example, as part of set-up and pre-processing verification. Step 1012*b* may be performed more than once, for example, once prior to step 1012*a* and once following step 1012*a*. In such embodiments, different operators may each perform step 1012*b*. For example, the scanning prior to step 1012*a* may be performed by a technician tasked with preparing rack systems for the chamber, and the scanning following step 1012*a* may be performed by a technician tasked with performing the actual processing of various units mounted on the rack system in the chamber.

At step 1012*c*, other data associated with processing is obtained. Such data may be obtained via scanning or retrieval from memory and it may contain a box identifier (e.g., a box number of a unit shipping/storage box). Such data may further contain configurations and operating modes correlated with data obtained at steps 1004-1008.

At step 1012*d*, processing of units of manufactured product commences. Such processing may include all or part of the processing to be performed. In one embodiment, at step 1012*d*, a first part of the processing is performed. In this embodiment, at step 1012*e*, a determination is made whether results from such first processing pass a unit or fail it. If the results fail, step 1012 may continue at step 1016 as illustrated in FIG. 10. If, at step 1012*e*, the results from the first processing pass the unit, a determination is made at step 1012*f* whether to perform additional processing. If the determination is made to stop processing, the method may continue to step 1016. If, however, the determination is made to perform additional processing, the method (step 1012) may return to step 1012*d* for performing additional processing (e.g., second or third iterations, etc.). The steps 1012*d-f* may be repeated until either the determination is made, at step 1012*e*, that the processing results fail the unit or the determination is made, at step 1012*f*, to stop processing. Whether to perform all processing in one or multiple iterations may depend on the type of processing, the type of technology incorporated in a unit or the like. For example, in embodiments in which processing includes both temperature testing and calibration, the processing may be performed in two or more iterations.

The method may include additional steps (not shown), for example, the step of identifying and labeling a unit as a failed unit. This may be done by manually attaching a label to the failing unit, making a data entry into a computerized device, automatically recording the identity of a failed unit, or any combination thereof.

In sum, the present invention contemplates various design approaches for processing units of manufactured products. Preferably, these approaches include removably mounting units on a rack system adapted for use by a relatively unskilled operator and mitigating interference between units of manufactured product during processing thereof. Although the present invention has been described in considerable detail with reference to certain preferred embodiments thereof, other embodiments are possible. Therefore, the spirit and scope of the appended claims should not be limited to the description of the preferred embodiments contained herein.

We claim:

1. A rack system, comprising:
   a rack having a frame;
   a plate removably coupled to the frame and having an interface opening configured for a particular operating mode relating to a wireless signal, the operating mode including an operating signal frequency range, the plate including an attachment mechanism configured for removably mounting on the plate a manufactured product having a configuration, the interface opening being further configured to at least partially prevent processing of the manufactured product if the particular operating mode mismatches the configuration of the manufactured product;
   an adapter coupled to the frame and configured for communicating operating signals to and from the manufactured product mounted on the plate; and
   a detector associated with the rack and configured to determine whether the particular operating mode matches the configuration of the manufactured product, the determining by the detector being independent of the communicating by the adapter.

2. A rack system as in claim 1, further comprising a shield attached to the plate and configured to mitigate interference generated by or affecting the manufactured product.

3. A rack system as in claim 2, wherein the interference includes one or more of electrical interference, electromagnetic interference, and acoustic interference.

4. A rack system as in claim 1, wherein the detector includes a data retrieval device configured to obtain data from the plate.

5. A rack system as in claim 4, wherein the data retrieval device is configured to obtain data from the manufactured product, the plate, and the rack.

6. A rack system as in claim 4, wherein the data includes one or more of the operating signal frequency range, a plate identifier, a rack identifier, a product identifier, a customer identifier, a serial number, and a part number.

7. A rack system as in claim 4, wherein the detector further includes a processor operatively coupled to the data retrieval device and configured to determine whether or not to commence processing of the manufactured product based on the data obtained from the data retrieval device.

8. A rack system as in claim 7, wherein the processor is further configured to determine whether or not there is a match between the configuration of the manufactured product and the particular operating mode of the plate, and the determination of whether or not to commence the processing is made based on the determination of whether or not there is a match.

9. A rack system as in claim 7, wherein the processor is configured to receive program instructions from a system external to the rack.

10. A rack system as in claim 9, wherein the system external to the rack is attachable to the rack.

11. A rack system as in claim 9, wherein the detector further includes memory.

12. A rack system as in claim 11, wherein the memory is configured to store the program instructions received by the processor.

13. A rack system as in claim 4, wherein the data retrieval device includes a scanner, a bar code reader, a keyboard, a key pad, a pointing device, a voice recognition device, or any combination thereof.

14. A rack system as in claim 1, wherein the attachment mechanism is configured to simulate field mounting of the manufactured product.

15. A rack system as in claim 1, wherein the plate is mechanically affixed to the frame.

16. A rack system as in claim 1, wherein the plate is mounted on the frame at a predetermined angle corresponding to a mounting angle of the particular operating mode of the plate.

17. A rack system as in claim 1, wherein the plate is mounted on the frame so that a manufactured product mounted on the plate assumes a vertical, horizontal, or other angled position, and the vertical, horizontal, or other angled position corresponds to a mounting angle of the particular operating mode of the plate.

18. A rack system as in claim 1, further comprising a carrier attached to the frame or on which the frame rests.

19. A rack system as in claim 1, further comprising a plate system associated with the plate, wherein the plate is configured for mounting thereon a plurality of manufactured products comprising the manufactured product, and the plate system is configured for communications between the plurality of manufactured products.

20. A rack system as in claim 19, wherein the plate system includes, for each of the plurality of manufactured products:
    an interface to each of the plurality of manufactured products;
    a unit adapter operatively coupled to the interface; and
    an attenuator operatively coupled to the unit adapter.

21. A rack system as in claim 20, wherein a pair of the attenuators in the plate system are connected to each other via a cable in order to facilitate communications between the mounted manufactured products associated with them.

22. A rack system as in claim 20, wherein the interface is adapted for a particular configuration associated with each of the plurality of manufactured to be mounted on the plate.

23. A rack system as in claim 20, wherein the unit adapter is configured for converting a signal form associated with a first medium surrounding each of the plurality of manufactured products mounted on the plate to a signal form associated with a second medium.

24. A rack system as in claim 20, further comprising a shield attached to the plate and wherein the interface, unit adapter and attenuator are housed in the shield.

25. A rack system as in claim 20, wherein the interface includes a waveguide interface and the unit adapter includes a waveguide adapter.

26. A rack system as in claim 1, wherein the frame is configured to support a plurality of plates comprising the plate.

27. A rack system as in claim 1, wherein the configuration of the manufactured product is associated with a particular signal frequency range.

28. A rack system as in claim 1, wherein the manufactured product comprises an outdoor unit of a split-mount microwave radio system.

29. A rack system as in claim 1, wherein the rack supports substantially simultaneous processing of a plurality of manufactured products, comprising the manufactured product.

30. A rack system as in claim 1, wherein the attachment mechanism includes a ramp and a stop coupled to the plate and configured to cooperatively allow mounting, securing in place, and demounting of the manufactured product without using additional fasteners or locking mechanisms.

31. A rack system as in claim 1, comprising a plurality of plates including the plate, and another plate configured to support mounting of another manufactured product having another configuration different from the configuration of the manufactured product.

32. A rack system as in claim 31, wherein at least two plates of the plurality of plates are configured for different operating modes.

33. A rack system as in claim 1, further comprising a connector coupled to the adapter and configured for transferring from the adapter operating signals directed to the manufactured product mounted on the plate.

34. A rack system as in claim 33, wherein the connector is configured for a connector mode of operation, wherein the rack has an identifier associated therewith, and wherein the detector is further configured for determining whether there is a match between any two or more of the configuration of the manufactured product, the particular operating mode of the plate, the connector mode of operation, and the rack identifier.

35. A method for processing manufactured products, comprising:
    providing a rack with a frame, the rack further including a plate having an interface opening configured for an operating mode relating to a wireless signal, the operating mode including an operating signal frequency range, the plate being removably mounted on the frame, the plate including an attachment mechanism configured for removably mounting on the plate a manufactured product having a configuration, and the interface opening being further configured to at least partially prevent processing of the manufactured product if the configuration of the mounted manufactured product mismatches the operating mode;
    providing a detector and an adapter
    removably mounting on the plate a particular manufactured product having a particular configuration;
    obtaining, via the detector, the operating mode from the plate and the particular configuration from the particular manufactured product;
    determining whether the particular operating mode matches the configuration of the particular manufactured product; and
    in response to determining that there is a match, evaluating whether processing of the particular manufactured product is to commence by communicating operating signals to and from the particular manufactured product via the adapter, the determining by the detector being independent of the communicating by the adapter.

36. A method as in claim 35, further comprising, in response to determining that there is no match, at least partially preventing processing of the particular manufactured product.

37. A method as in claim 35, wherein the plate includes an attachment mechanism including a ramp opening and a stop, and wherein removably mounting the plate includes:
    inserting a mounting stud coupled to the particular manufactured product into the ramp opening; and
    locking the particular manufactured product to the plate by turning the inserted mounting stud in the ramp until it reaches the stop.

38. A method as in claim 35, wherein the operating signals are used for one or more of calibration, thermal testing, and manufacturing testing of the particular manufactured product.

39. A method as in claim 35, further comprising providing a shield coupled to the plate for mitigating interference with or from the particular manufactured product mounted on the plate.

40. A method as in claim 35, wherein removably mounting the particular manufactured product on the plate simulates field mounting of the particular manufactured product.

41. A method as in claim 35, wherein the determining whether the particular operating mode matches the configuration of the particular manufactured product is performed by a processor executing program instructions.

42. A method as in claim 41, wherein memory is configured to store the program instructions executed by the processor.

\* \* \* \* \*